(12) United States Patent
Holber et al.

(10) Patent No.: US 8,779,322 B2
(45) Date of Patent: *Jul. 15, 2014

(54) METHOD AND APPARATUS FOR PROCESSING METAL BEARING GASES

(75) Inventors: William M. Holber, Winchester, MA (US); John A. Smith, North Andover, MA (US); Xing Chen, Lexington, MA (US); Donald K. Smith, Belmont, MA (US)

(73) Assignee: MKS Instruments Inc., Andover, MA (US)

( * ) Notice: Subject to any disclaimer, the term of this patent is extended or adjusted under 35 U.S.C. 154(b) by 174 days.

This patent is subject to a terminal disclaimer.

(21) Appl. No.: 13/336,616

(22) Filed: Dec. 23, 2011

(65) Prior Publication Data

US 2012/0160059 A1 Jun. 28, 2012

Related U.S. Application Data

(60) Continuation of application No. 12/511,785, filed on Jul. 29, 2009, now Pat. No. 8,124,906, which is a division of application No. 11/269,917, filed on Nov. 8, 2005, now Pat. No. 7,569,790, which is a continuation-in-part of application No. 10/837,912, filed on May 3, 2004, now Pat. No. 7,166,816, which is a continuation of application No. 09/804,650, filed on Mar. 12, 2001, now Pat. No. 6,815,633, which is a continuation-in-part of application No. 09/774,165, filed on Jan. 26, 2001, now Pat. No. 6,924,455, which is a continuation-in-part of application No. 09/659,881, filed on Sep. 12, 2000, now Pat. No. 6,486,431, which is a continuation of application No. 08/883,281, filed on Jun. 26, 1997, now Pat. No. 6,150,628.

(60) Provisional application No. 60/625,838, filed on Nov. 8, 2004.

(51) Int. Cl.
*B23K 10/00* (2006.01)
*H01H 1/34* (2006.01)

(52) U.S. Cl.
USPC ............ 219/121.41; 219/121.43; 219/121.52; 219/121.59

(58) Field of Classification Search
CPC .................................. H01H 1/34; B23K 10/00
USPC ............... 219/121.36, 121.52, 121.59, 121.4, 219/121.41, 121.43, 121.44; 118/723 R, 118/723 I; 156/345.48
See application file for complete search history.

(56) References Cited

U.S. PATENT DOCUMENTS

| | | |
|---|---|---|
| 2,981,902 A | 4/1961 | Familier |
| 3,054,742 A | 9/1962 | Thonemann et al. |

(Continued)

FOREIGN PATENT DOCUMENTS

| | | | |
|---|---|---|---|
| DE | 39 42 560 C2 | 5/1996 | |
| EP | 0 291 181 A2 | 11/1988 | .............. H01J 37/32 |

(Continued)

OTHER PUBLICATIONS

Schlier et al., "Production of High-Value Fluoride Gas from Uranium Tetrafluoride Using a Rotary Calciner," WM'01 Conference, Feb. 25-Mar. 1, 2001, Tucson, AZ (12 pages).

(Continued)

*Primary Examiner* — Mark Paschall
(74) *Attorney, Agent, or Firm* — Proskauer Rose LLP

(57) ABSTRACT

A method and apparatus for processing metal bearing gases involves generating a toroidal plasma in a plasma chamber. A metal bearing gas is introduced into the plasma chamber to react with the toroidal plasma. The interaction between the toroidal plasma and the metal bearing gas produces at least one of a metallic material, a metal oxide material or a metal nitride material.

10 Claims, 15 Drawing Sheets

(56) References Cited

U.S. PATENT DOCUMENTS

| | | |
|---|---|---|
| 3,109,801 A | 11/1963 | Thonemann |
| 3,278,384 A | 10/1966 | Lenard et al. |
| 3,343,022 A | 9/1967 | Eckert |
| 3,433,705 A | 3/1969 | Cornish |
| 3,500,118 A | 3/1970 | Anderson |
| 3,509,500 A | 4/1970 | McNair et al. |
| 3,663,361 A | 5/1972 | Yoshikawa |
| 3,794,941 A | 2/1974 | Templin |
| 3,801,438 A | 4/1974 | Ohkawa |
| 3,906,405 A | 9/1975 | Kommrusch |
| 3,935,503 A | 1/1976 | Ress |
| 3,987,334 A | 10/1976 | Anderson |
| 4,049,940 A | 9/1977 | Moisan et al. |
| 4,057,462 A | 11/1977 | Jassby et al. |
| 4,065,369 A | 12/1977 | Ogawa et al. |
| 4,073,680 A | 2/1978 | Kelley |
| 4,088,926 A | 5/1978 | Fletcher et al. |
| 4,095,198 A | 6/1978 | Kirby |
| 4,110,595 A | 8/1978 | Brambilla et al. |
| 4,112,045 A | 9/1978 | Seko et al. |
| 4,118,205 A | 10/1978 | Wang |
| 4,180,763 A | 12/1979 | Anderson |
| 4,201,960 A | 5/1980 | Skutta et al. |
| 4,206,073 A | 6/1980 | Hesky et al. |
| 4,252,609 A | 2/1981 | Kerst et al. |
| 4,263,096 A | 4/1981 | Ohkawa et al. |
| 4,282,267 A | 8/1981 | Küyel |
| 4,285,800 A | 8/1981 | Welty |
| 4,292,124 A | 9/1981 | Fisch |
| 4,292,125 A | 9/1981 | Bers |
| 4,324,611 A | 4/1982 | Vogel et al. |
| 4,350,578 A | 9/1982 | Frieser et al. |
| 4,368,092 A | 1/1983 | Steinberg et al. |
| 4,431,898 A | 2/1984 | Reinberg et al. |
| 4,431,901 A | 2/1984 | Hull |
| 4,461,954 A | 7/1984 | Inoue |
| 4,486,722 A | 12/1984 | Landt |
| 4,486,723 A | 12/1984 | Lysobey |
| 4,546,611 A | 10/1985 | Eby et al. |
| 4,601,871 A | 7/1986 | Turner |
| 4,626,400 A | 12/1986 | Jassby et al. |
| 4,631,105 A | 12/1986 | Carroll et al. |
| H268 H | 5/1987 | Owen |
| 4,668,336 A | 5/1987 | Shimkunas |
| 4,668,366 A | 5/1987 | Zarowin |
| 4,679,007 A | 7/1987 | Reese et al. |
| 4,680,694 A | 7/1987 | Huynh et al. |
| 4,689,192 A | 8/1987 | Nagata |
| 4,732,761 A | 3/1988 | Machida et al. |
| 4,735,765 A | 4/1988 | Harris et al. |
| 4,748,383 A | 5/1988 | Houkes |
| 4,767,590 A | 8/1988 | Stix et al. |
| 4,769,064 A | 9/1988 | Buss et al. |
| 4,777,061 A | 10/1988 | Wu et al. |
| 4,779,182 A | 10/1988 | Mickal et al. |
| 4,780,803 A | 10/1988 | Dede Garcia-Santamaria |
| 4,786,352 A | 11/1988 | Benzing |
| H554 H | 12/1988 | Dawson et al. |
| 4,793,975 A | 12/1988 | Drage |
| 4,794,217 A | 12/1988 | Quan et al. |
| 4,810,933 A | 3/1989 | Moisan et al. |
| H627 H | 4/1989 | Peng |
| 4,853,250 A | 8/1989 | Boulos et al. |
| 4,859,399 A | 8/1989 | Bussard |
| 4,859,908 A | 8/1989 | Yoshida et al. |
| 4,861,622 A | 8/1989 | Yamazaki et al. |
| 4,863,671 A | 9/1989 | Okada |
| 4,877,757 A | 10/1989 | York et al. |
| 4,878,149 A | 10/1989 | Stiehl et al. |
| 4,897,282 A | 1/1990 | Kniseley et al. |
| 4,906,898 A | 3/1990 | Moisan |
| 4,908,492 A | 3/1990 | Okamoto et al. |
| 4,913,929 A | 4/1990 | Moslehi et al. |
| 4,918,031 A | 4/1990 | Flamm et al. |
| 4,948,458 A | 8/1990 | Ogle |
| 4,985,113 A | 1/1991 | Fujimoto et al. |
| 4,996,077 A | 2/1991 | Moslehi et al. |
| 5,000,771 A | 3/1991 | Fleming, Jr. et al. |
| 5,008,593 A | 4/1991 | Schlie et al. |
| 5,016,332 A | 5/1991 | Reichelderfer et al. |
| 5,030,889 A | 7/1991 | El-Hamamsy et al. |
| 5,041,760 A | 8/1991 | Koloc |
| 5,061,838 A | 10/1991 | Lane et al. |
| 5,099,100 A | 3/1992 | Bersin et al. |
| 5,106,827 A | 4/1992 | Borden et al. |
| 5,130,003 A | 7/1992 | Conrad |
| 5,144,196 A | 9/1992 | Gegenwart et al. |
| 5,153,484 A | 10/1992 | El-Hamamsy |
| 5,180,150 A | 1/1993 | Prusak et al. |
| 5,187,344 A | 2/1993 | Mizuno et al. |
| 5,187,454 A | 2/1993 | Collins et al. |
| 5,198,718 A | 3/1993 | Davis et al. |
| 5,200,595 A | 4/1993 | Boulos et al. |
| 5,206,516 A | 4/1993 | Keller et al. |
| 5,238,532 A | 8/1993 | Zarowin et al. |
| 5,254,830 A | 10/1993 | Zarowin et al. |
| 5,277,751 A | 1/1994 | Ogle |
| 5,280,154 A | 1/1994 | Cuomo et al. |
| 5,285,372 A | 2/1994 | Huynh et al. |
| 5,290,382 A | 3/1994 | Zarowin et al. |
| 5,291,415 A | 3/1994 | Zarowin et al. |
| 5,298,103 A | 3/1994 | Steinberg et al. |
| 5,303,139 A | 4/1994 | Mark |
| 5,336,355 A | 8/1994 | Zarowin et al. |
| 5,346,578 A | 9/1994 | Benzing et al. |
| 5,352,249 A | 10/1994 | Vollaro |
| 5,353,314 A | 10/1994 | Schaffer |
| 5,359,180 A | 10/1994 | Park et al. |
| 5,364,496 A | 11/1994 | Bollinger et al. |
| 5,364,600 A | 11/1994 | Stiehl et al. |
| 5,365,147 A | 11/1994 | Shinohara et al. |
| 5,372,674 A | 12/1994 | Steinberg |
| 5,376,224 A | 12/1994 | Zarowin |
| 5,394,061 A | 2/1995 | Fujii |
| 5,397,962 A | 3/1995 | Moslehi |
| 5,401,350 A | 3/1995 | Patrick et al. |
| 5,405,480 A | 4/1995 | Benzing et al. |
| 5,406,177 A | 4/1995 | Nerone |
| 5,414,238 A | 5/1995 | Steigerwald et al. |
| 5,419,803 A | 5/1995 | Mumola |
| 5,430,355 A | 7/1995 | Paranjpe |
| 5,440,206 A | 8/1995 | Kurono et al. |
| 5,458,732 A | 10/1995 | Butler et al. |
| 5,460,689 A | 10/1995 | Raaijmakers et al. |
| 5,468,296 A | 11/1995 | Patrick et al. |
| 5,468,955 A | 11/1995 | Chen et al. |
| 5,472,561 A | 12/1995 | Williams et al. |
| 5,473,291 A | 12/1995 | Brounley |
| 5,474,648 A | 12/1995 | Patrick et al. |
| 5,479,072 A | 12/1995 | Dakin et al. |
| 5,505,780 A | 4/1996 | Dalvie et al. |
| 5,506,507 A | 4/1996 | Schwierzke et al. |
| 5,514,246 A | 5/1996 | Blalock |
| 5,515,167 A | 5/1996 | Ledger et al. |
| 5,534,231 A | 7/1996 | Savas |
| 5,556,549 A | 9/1996 | Patrick et al. |
| 5,563,709 A | 10/1996 | Poultney |
| 5,565,036 A | 10/1996 | Westendorp et al. |
| 5,565,247 A | 10/1996 | Suzuki |
| 5,567,255 A | 10/1996 | Steinberg |
| 5,567,268 A | 10/1996 | Kadomura |
| 5,568,015 A | 10/1996 | Holber et al. |
| 5,573,595 A | 11/1996 | Dible |
| 5,576,629 A | 11/1996 | Turner et al. |
| 5,585,766 A | 12/1996 | Shel |
| 5,610,102 A | 3/1997 | Gardopee et al. |
| 5,618,382 A | 4/1997 | Mintz et al. |
| 5,630,880 A | 5/1997 | Eastlund |
| 5,637,279 A | 6/1997 | Besen et al. |
| 5,639,519 A | 6/1997 | Patrick et al. |
| 5,643,364 A | 7/1997 | Zhao et al. |
| 5,647,913 A | 7/1997 | Blalock |
| 5,654,679 A | 8/1997 | Mavretic et al. |
| D384,173 S | 9/1997 | Godyak et al. |

(56) References Cited

U.S. PATENT DOCUMENTS

| | | | |
|---|---|---|---|
| 5,662,819 | A | 9/1997 | Kadomura |
| 5,670,881 | A | 9/1997 | Arakawa et al. |
| 5,681,393 | A | 10/1997 | Takagi |
| 5,685,949 | A | 11/1997 | Yashima |
| 5,688,415 | A | 11/1997 | Bollinger et al. |
| 5,700,297 | A | 12/1997 | Vollaro |
| 5,712,592 | A | 1/1998 | Stimson et al. |
| 5,747,935 | A | 5/1998 | Porter et al. |
| 5,756,400 | A | 5/1998 | Ye et al. |
| 5,767,628 | A | 6/1998 | Keller et al. |
| 5,773,919 | A | 6/1998 | Seward |
| 5,779,849 | A | 7/1998 | Blalock |
| 5,789,867 | A | 8/1998 | Westendorp et al. |
| 5,798,016 | A | 8/1998 | Oehrlein et al. |
| 5,811,022 | A | 9/1998 | Savas et al. |
| 5,814,154 | A | 9/1998 | Boitnott |
| 5,834,905 | A | 11/1998 | Godyak et al. |
| 5,868,909 | A | 2/1999 | Eastlund |
| 5,874,012 | A | 2/1999 | Kanai et al. |
| 5,883,470 | A | 3/1999 | Hatakeyama et al. |
| 5,892,198 | A | 4/1999 | Barnes et al. |
| 5,901,338 | A | 5/1999 | Nachtrab et al. |
| 5,914,278 | A | 6/1999 | Boitnott et al. |
| 5,918,106 | A | 6/1999 | Bulko et al. |
| 5,932,180 | A | 8/1999 | Zhang et al. |
| 5,939,886 | A | 8/1999 | Turner et al. |
| 5,965,034 | A | 10/1999 | Vinogradov et al. |
| 5,998,933 | A | 12/1999 | Shun'ko |
| 6,007,879 | A | 12/1999 | Scholl |
| 6,033,642 | A | 3/2000 | Bulko et al. |
| 6,041,735 | A | 3/2000 | Murzin et al. |
| 6,053,810 | A | 4/2000 | Medina |
| 6,063,233 | A | 5/2000 | Collins et al. |
| 6,096,281 | A | 8/2000 | Bulko et al. |
| 6,150,628 | A | 11/2000 | Smith et al. |
| 6,153,164 | A | 11/2000 | Bulko et al. |
| 6,164,241 | A | 12/2000 | Chen et al. |
| 6,253,704 | B1 | 7/2001 | Savas |
| 6,303,090 | B1 | 10/2001 | Rothman et al. |
| 6,352,677 | B1 | 3/2002 | Hage et al. |
| 6,424,232 | B1 | 7/2002 | Mavretic et al. |
| 6,459,066 | B1 | 10/2002 | Khater et al. |
| 6,872,909 | B2 | 3/2005 | Holber et al. |
| 7,193,369 | B2 | 3/2007 | Min et al. |
| 2004/0079287 | A1 | 4/2004 | Smith et al. |
| 2009/0068082 | A1 | 3/2009 | Mills |

FOREIGN PATENT DOCUMENTS

| | | | | |
|---|---|---|---|---|
| EP | 1 145 759 | A1 | 10/2001 | ............... B01J 12/00 |
| JP | 59221694 | | 12/1984 | |
| JP | 60-48195 | | 3/1985 | |
| JP | 60-56298 | | 4/1985 | |
| JP | 61-1024 | | 1/1986 | |
| JP | 61-80088 | | 4/1986 | |
| JP | 61-139029 | | 6/1986 | |
| JP | 1-119029 | | 5/1989 | |
| JP | 2-260399 | | 10/1990 | |
| JP | 03-67497 | | 3/1991 | |
| JP | 5-144594 | | 6/1993 | |
| JP | 5-166595 | | 7/1993 | |
| JP | H06-291067 | | 10/1994 | |
| JP | 7-176524 | | 7/1995 | |
| JP | H07-187679 | | 7/1995 | |
| JP | 8-292278 | | 11/1996 | |
| JP | 08-311647 | | 11/1996 | |
| JP | H10-109019 | | 4/1998 | |
| JP | 11-005013 | A | 1/1999 | |
| JP | 2002-507315 | | 3/2002 | |
| RU | 2022917 | | 11/1994 | |
| RU | 2056702 | | 3/1996 | |
| RU | 2094961 | | 10/1997 | |
| SU | 957744 | A1 | 2/1996 | |
| WO | WO 90/10945 | | 9/1990 | |

OTHER PUBLICATIONS

Price, "Potential Uses of Depleted Uranium," American Nuclear Society, 2000 International Winter and Embedded Topical Meetings, Washington, D.C., Nov. 12B16, 2000; Jun. 2000 (5 pages).

Quapp et al., "New Options for Managing Depleted Uranium Materials," Submitted for Publication to Spectrum 98 (6 pages).

"Summary of the Engineering Analysis Report for the Long-term Management of Depleted Uranium Hexafluoride," Work performed under the auspices of the U.S. Department of Energy by Lawrence Livermore National Laboratory under Contract W-7405-ENG-48, UCRL-ID-124080, Sep. 1997 (105 pages).

White, "Availability of Uranium Feed for the Fissile Materials Disposition Program," V-1: Depleted Uranium Hexafluoride, ORNL/TM-13417 Rev. 1, Prepared by ORNL, Oak Ridge, Tennessee 37831-6285 managed by Lockheed Martin Energy Research Corp. for the U.S. Department of Energy under Contract DE-AC05-96OR22464, Nov. 1997 (48 pages).

Van Hoornich, et al., "Recovery of Tungsten from the Exhaust of a Tungsten Chemical Vapor Deposition Tool," Journal of the Electrochemical Society, 147 (12), 2000, pp. 4665-4670.

S.V. Dresvin, Physics & Tech. of Low Temp. Plasmas, H. Eckert ed, p. 234 (1977).

H.U. Eckert, "Analysis of Thermal Induction Plasmas between Coaxial Cylinders" *J Appl Phys* 43(1):46-52 (1972).

H.U. Eckert, "An Electrodeless Discharge at 60 Hz" *IEEE Trans on Plasma Sci* PS-2:308-309 (1974).

H.U. Eckert, "The Induction Arc: A State-of-the-Art Review" *High Temp Sci* 6:99-134 (1974).

H.U. Eckert, "Induction Plasmas as Low Frequencies" *AIAA Journal* 9(8):1452-1456 (1971).

V.M. Gol'dfarb et al., "Properties of a Low-Frequency Discharge in a Transformer Plasmatron" *Teplofizika Vysokikh Temperatur* 17(4):698-702 (1979).

E. Kandler et al., "Characterization of Plasma in an Inductively Coupled High-Dense Plasma Source" *Surface Coatings & Tech* 74 75:539-545 (1995).

V.A. Kogan et al., "Investigation of the Prospect for the Design of Transformer-Type Plasmotrons" *Teplofizika Vysokikh Temperatur* 31(1):105-110 (1993).

R.A. Krakowski et al., "Prospects for Using Low-Frequency Induction Plasmas for Bulk-Chemical Processing: A Systems Analysis" First INEL Workshop on Plasma Applications to Waste Treatment, Idaho Fall, Idaho, Jan. 16-17, 1991.

G. Soucy et al., "Parametric Study of the Decomposition of $NH_3$ for an Induction Plasma Reactor Design" *Plasma Chem. and Plasma Prof.* 15(4):693-710 (1995).

T.B. Reed, "Induction-Coupled Plasma Torch" *J. Appl. Phys.* 32(5):821-824 (1961).

T.B. Reed, "Growth of Refractory Crystals Using the Induction Plasma Torch" *J. Appl. Phys.* 32(12)2534-2535 (1961).

T.B. Reed, "Heat-Transfer Intensity from Induction Plasma Flames and Oxy-Hydrogen Flames" J. Appl. Phys. 34(8)2266-2269 (1963).

T.B. Reed, "High-Power Low-Density Induction Plasmas" *Communications* 3146-3147 (1963).

F. Maier, "Electronic Circuits for the Generation and Transfer of High-Power Pulses in Nuclear Fusion Installations" *IEEE Transactions on Plasma Science* PS-12(3): 191-198 (1984).

International Search Report dated Nov. 5, 1998 in corresponding PCT Application No. PCT/US98/13155.

Osram Endura 150W Product Information Brochure, Nov. 1996, pp. 1-4.

Hiramatsu et al., "Generation of Strongly Ionized Aluminum Plasma in a Low-Temperature Tokamak Discharge," *Japanese Journal of Applied Physics*, vol. 31 (Jul. 1992) pp. 2243-2248.

Zhang et al., "A High Power Radio Frequency Transformer for Plasma Production in a Toroidal Plasma Source," *Rev. Sci. Instrum.*, vol. 69 (Jan. 1998) pp. 101-108.

Akulina et al., "Injection and Confinement of Plasma in a Stellarator with a Multipolar (1=2) Helical Field," *Proceedings of Conference of International Atomic Energy Agency* (1965) pp. 733-749.

(56) References Cited

OTHER PUBLICATIONS

Anderson, "Electrodeless Fluorescent Lamps Excited by Solenoidal Electric Field," *IES Transaction, Illuminating Engineering* (Apr. 1969) pp. 236-242.
Ashida et al., "Measurements of Pulsed-Power Modulated Argon Plasmas in an Inductively Coupled Plasma Source," *J. Vac. Sci. Technol.*, (Mar./Apr. 1996) pp. 391-397.
Asmussen, "Electron Cyclotron Resonance Microwave Discharges for Etching and Thin-Film Deposition," *Journal of Vacuum Science & Technology A: Vacuum, Surfaces, and Films*, vol. 7, No. 3 (May 1989) pp. 883-893. Abstract printed from Online Journal Publishing Service.
Bacri et al., "Influence of Departures From Complete Thermodynamic Equilibrium on Transport Coefficient Values: Application to an Oxygen Plasma," *Plasma Sources Sci. Technol.*, (1994) pp. 114-121.
Baldwin et al., "$MgF_2$ Optical Films: Ion-Beam-Assisted Deposition of Magnesium Fluoride in a Conventional Electron Beam Evaporator and the Resulting Film Properties," *Society of Vacuum Coaters 40th Annual Technical Conference Proceedings* (1997) pp. 1-5.
Bell, "Ring Discharge Excitation of Gas Ion Lasers," *Applied Physics Letters*, vol. 7, No. 7 (Oct. 1965) p. 190.
Benova et al., "Axial Distributions of Metastable Atoms and Charged Particles in an Ultrahigh Frequency Argon Plasma Column at Moderate Pressures," *J. Appl. Phys.*, vol. 79, No. 8 (Apr. 15, 1996) pp. 3848-3852.
Benova et al., "Theoretical Study of the Influence of a Metal Enclosure on the Parameters of a Plasma Column Sustained by a Traveling Electromagnetic Surface Wave," *Physica Scripta*, vol. 43 (1991) p. 68-73.
Bhave et al., "Two- and Three-Body Ion-Electron Recombination Rate Coefficients in Neon*," *Aust. J. Phys.*, vol. 48 (1995) pp. 503-513.
Bishop et al., "Power Balance Measurements and Particle Loss Rate in Ohmically Heated Discharges in the C Stellarator," *Plasma Physics and Controlled Nuclear Fusion Research: Proceedings of Second Conference of International Atomic Energy Agency*, vol. 2 (1966) pp. 673-685.
Bluem et al., "Spatial Investigation of a Large Diameter Microwave Plasma," *J. Phys. D: Appl. Phys.* vol. 28 (1995) pp. 1529-1533.
Böhle et al., "On the Influence of Excited Atoms on the Electron Kinetics of a Surface Wave Sustained Argon Plasma," *Plasma Sources Sci. Technol.* vol. 3 (1994) pp. 80-87.
Boisse-Laporte et al., "Microwave Discharges Produced by Surface Waves in Argon Gas," *Journal of Physics D: Applied Physics*, vol. 20 (Feb. 14, 1987) p. 197.
Bol, "Density Fluctuations in the Etude Stellarator," *The Physics of Fluids*, vol. 7, No. 11 (Nov. 1964) pp. 1855-1856.
Bollinger et al., "Rapid, Nonmechanical, Damage-Free Figuring of Optical Surfaces Using Plasma-Assisted Chemical Etching (PACE): Part I Experimental Results," *SPIE vol. 966 Advances in Fabrication and Metrology for Optics and Large Optics*, (1988) pp. 82-90.
Bollinger et al., "Rapid, Non-Contact Optical Figuring of Aspheric Surfaces With Plasma Assisted Chemical Etching (PACE)," *SPIE vol. 1333 Advanced Optical Manufacturing and Testing* (1990) pp. 44-57.
Bollinger et al., "Rapid Optical Figuring of Aspherical Surfaces With Plasma Assisted Chemical Etching (PACE)," *SPIE vol. 1618 Large Optics II* (1991) pp. 14-21.
Boswell et al., "Etching of Si by $SF_6$ in a Radio Frequency Double Cathode," *Journal of Vacuum Science & Technology B: Microelectronics and Nanometer Structures*, vol. 5, No. 4 (Jul. 1987) pp. 883-888. Abstract printed from Online Journal Publishing Service.
Bourdon et al., "Three-Body Recombination Rate of Atomic Nitrogen in Low-Pressure Plasma Flows," *Physical Review E.*, vol. 54, No. 2 (Aug. 1996) pp. 1888-1898.
Carruth, Jr., et al., "Method for Determination of Neutral Atomic Oxygen Flux," *Rev. Sci. Instrum.*, vol. 61, No. 4 (1990) pp. 1211-1216.
Chen, "Industrial Applications of Low-Temperature Plasma Physics*," *Phys. Plasmas*, vol. 2, No. 6 (Jun. 1995) pp. 2164-2175.

Cherrington, "Chapter 8: DC Discharges—The Positive Column," *Gaseous Electronics and Gas Lasers* Pergamon Press—New York (1979) pp. 144-160.
Chiu et al., "What the DryScrub® System Can Do for PFC Gas Treatment?," *Electrochemical Technology Corp. Brochure* (undated).
Coburn et al., "Ion-and Electron-Assisted Gas-Surface Chemistry—An Important Effect in Plasma Etching," *Journal of Applied Physics*, vol. 50, No. 5 (May 1979) pp. 3189-3196. Abstract printed from Online Journal Publishing Service.
Cohen et al., "Induced Magnetic Field Effects in Inductively Coupled Plasmas," *Physics of Plasma*, vol. 3, No. 5 (May 1996) pp. 1839-1847. Abstract printed from Online Journal Publishing Service.
Collins et al., "Measurement of the Rate Coefficient for the Recombination of $He^+$ with Electrons*," *Physical Review A*, vol. 6, No. 4 (Oct. 1972) pp. 1545-1558.
Darchicourt et al., "Influence of the Radial Electron Density Profile on the Determination of the Characteristics of Surface-Wave-Produced Discharges," *J. Phys. D: Applied Physics*, vol. 21 (1988) pp. 293-301.
Denneman, "Determination of Electromagnetic Properties of Low-Pressure Electrodeless Inductive Discharges," *J. Phys. D: Appl. Phys.* (1990) pp. 293-298.
Eckhartt et al., "Comparison of Alkali Plasma Loss Rates in a Stellarator and in a Toroidal Device With Minimum Mean-B Properties," *Plasma Physics and Controlled Nuclear Fusion Research: Proceedings of Second Conference of International Atomic Energy Agency*, vol. 2 (1966) pp. 719-731.
Evans, "Discussion (of 'Electrodeless Fluorescent Lamps Excited by Solenoidal Electric Field' by Anderson)," *IES Transaction, Illuminating Engineering* (Apr. 1969) pp. 242-244.
Feoktistov et al., "Self-Consistent Modeling of Low-Pressure RF Discharges in Oxygen Plasma," *J. Phys. D: Appl. Phys.* vol. 26 (1995) pp. 1346-1353.
Ferreira, "Theory of a Plasma Column Sustained by a Surface Wave," *J. Phys. D: Appl. Phys.* (1981) pp. 1811-1830.
Ferreira, "Modeling of a Low-Pressure Plasma Column Sustained by a Surface Wave," *J. Phys. D: Appl. Phys.* vol. 16 (1983) p. 1673-1685.
Ferreira, "The Similarity Laws for the Maintenance Field and the Absorbed Power per Electron in Low-Pressure Surface Wave Produced Plasmas and their Extension to HF Plasmas in General," *Physica Scripta*, vol. 38 (1988) pp. 382-399.
Ferreira et al., "Quasi-Neutral Theory of Positive Columns in Electronegative Gases," *J. Phys. D: Appl. Phys.*, vol. 21 (1988) pp. 1403-1413.
Ferreira, "Kinetic Modeling of Microwave Discharges," *Microwave Discharges: Fundamentals and Applications* (1993) pp. 313-337.
Fiala et al., "Two-Dimensional, Hybrid Model of Low-Pressure Glow Discharges," *Physical Review E.*, vol. 49, No. 6 (Jun. 1994) pp. 5607-5622.
Fulton, "Application of Ion-Assisted-Deposition Using a Gridless End-Hall Ion Source for Volume Manufacturing of Thin-Film Optical Filters," *Optical Interference Coatings: Proceedings—SPIE The International Society for Optical Engineering* (1994) pp. 374-393.
Fulton et al., "Application of Residual Stress Analysis for Ion-Assist-Deposited (IAD) Thin-Films Manufactured Using a Gridless End-Hall Ion Source," *Optical Interference Coatings: Technical Digest Series*, vol. 17 (1995) pp. 101-103.
Gallatin et al., "Predicted Polishing Behavior of Plasma Assisted Chemical Etching (PACE) From a Unified Model of the Temporal Evolution of Etched Surfaces," *SPIE Advances in Fabrication and Metrology for Optics and Large Optics*, vol. 966 (1988) pp. 98-107.
Gallatin et al., "Unified Approach to the Temporal Evolution of Surface Profiles in Solid Etch and Deposition Processes," *J. Appl. Phys.*, vol. 65, No. 12 (Jun. 1989) pp. 5078-5088.
Golant et al., "Plasma Compression by a Magnetic Field in a Toroidal-Type Device," *Proceedings of Conference of International Atomic Energy Agency* (1965) pp. 830-850.
Gousset et al., "Experimental Study of a D.C. Oxygen Glow Discharge by V.U.V. Absorption Spectroscopy," *Plasma Chemistry and Plasma Processing* vol. 7, No. 4 (1987) pp. 409-427.
Gousset et al., "Electron and Heavy-Particle Kinetics in the Low Pressure Oxygen Positive Column," *J. Phys. D: Appl. Phys.*, vol. 24 (1991) pp. 290-300.

(56) References Cited

OTHER PUBLICATIONS

Granier et al., "Characterisation of Oxygen Discharges," Journal of Physics D: Applied Physics, vol. 22 (1989) pp. 1487-1496.
Granier et al., "Diagnostics in $O_2$ Helicon Plasmas for $SiO_2$ Deposition," *Plasma Sources Sci. Technol.*, vol. 6 (1997) pp. 147-156.
Hartney et al., "Critical Review: Oxygen Plasma Etching for Resist Stripping and Multilayer Lithography," *J. Vac. Sci. Technol.*, pp. 1 (Jan./Feb. 1989).
Heimer et al., "Ponderomotive Transport of Charge in the Induction Plasma," *J. Vac. Sci. Technol.*, (Jan./Feb. 1994) pp. 507-511.
Henriksen et al., "Electromagnetic Field in Electrodeless Discharge," *Journal of Applied Physics*, vol. 42, No. 13 (Dec. 1971) pp. 5460-5464.
Heshmaty et al., "Approaches Explored for Producing a Variety of Ion-Assisted-Deposited Thin-Film Coatings Using an End-Hall Ion Source," *Developments in Optical Component Coatings: Proceedings of SPIE Conference*, vol. 2776 (1996) pp. 114-125.
Hopwood, "Review of Inductively Coupled Plasmas for Plasma Processing," *Plasma Sources Sci. Technol.*, (1992) pp. 109-116.
Hopwood et al., "Electromagnetic Fields in a Radio-Frequency Induction Plasma," *Journal of Vacuum Science & Technology A: Vacuum, Surfaces, and Films*, vol. 11, No. 1 (Jan. 1993) pp. 147-151. Abstract printed from Online Journal Publishing Service.
Hopwood et al., "Langmuir Probe Measurements of a Radio Frequency Induction Plasma," *Journal of Vacuum Science & Technology A: Vacuum, Surfaces, and Films*, vol. 11, No. 1 (Jan. 1993) pp. 152-156. Abstract printed from Online Journal Publishing Service.
Kita et al., "Rocket Observation of Atomic Oxygen and Night Airglow: Measurement of Concentration with an Improved Resonance Fluorescence Technique," *Annales Geophysicae*, vol. 14 (1996) 227-237.
Kolobov et al., "Electron Kinetics and Non-Joule Heating in Near-Collisionless Inductively Coupled Plasmas," *Physical Review E*, vol. 55, No. 3 (Mar. 1997) 3408-3422.
Kortshagen et al., "Determination of Electron Energy Distribution Functions in Surface Wave Produced Plasmas: I. Modeling," *J. Phys. D: Appl. Phys.*, vol. 24 (1991) pp. 1571-1584.
Kortshagen et al., "Determination of Electron Energy Distribution Functions in Surface Wave Produced Plasmas: II. Measurements," *J. Phys. D: Appl. Phys.*, vol. 24 (1991) pp. 1585-1593.
Kortshagen, "Experimental and Theoretical Determination of Electron Energy Distribution Functions in Surface Wave Plasmas," *Microwave Discharges: Fundamentals and Applications* (1993) pp. 303-312.
Kouznetsov et al., "Modeling Electronegative Discharges at Low Pressure," *Plasma Sources Science & Technology*, vol. 5, No. 4 (Nov. 1996) Abstract printed from Insititue for Scientific Information.
Lee et al., "Global Model for High Pressure Electronegative Radio-Frequency Discharges," *Journal of Vacuum Science & Technology A—Vacuum Surfaces and Films* vol. 15, No. 1 (Jan.-Feb. 1997) 113-126. Abstract printed from Institute for Scientific Information.
Lichtenberg et al., "Modeling Plasma Discharges at High Electronegativity," *Plasma Sources Sci. Technol.* vol. 6 (1997) 437-449.
Lister et al., "Modeling of Inductively Coupled Discharges With Internal and External Coils," *Plasma Sources Sci. Technol.* vol. 1 (1992) 67-73.
Malik et al., "Overview of Plasma Source Ion Implantation Research at University of Wisconsin-Madison," *Journal of Vacuum Science & Technology B: Microelectronics and Nanometer Structures* vol. 12, No. 2 (Mar. 1994) 843-849. Abstract printed from Online Journal Publishing Service.
Margot et al., "Modeling of Surface-Wave-Sustained Plasmas in Static Magnetic Fields: A Tool for the Study of Magnetically Assisted HF Plasmas," *Microwave Discharges: Fundamentals and Applications* (1993) 141-159.
Michelt et al., "Measurement of the Rotational Temperature of Oxygen in a High-Power Inductively Coupled Plasma," *J. Phys. D: Appl. Phys.* vol. 28 (1995) 2600-2606.

Moisan et al., "A Small Microwave Plasma Source for Long Column Production Without Magnetic Field," *IEEE Transactions on Plasma Science*, vol. PS-3, No. 2 (Jun. 1975) p. 55.
Moisan et al., "Plasma Sources Based on the Propagation of Electromagnetic Surface Waves," *J. Phys. D: Appl. Phys.* vol. 24 (1991) pp. 1025-1048.
Morrow et al., "In Situ Measurement of Atomic Nitrogen in the Ground ($^4$S) and Metastable ($^2$D) and ($^2$P) States by Resonance Fluorescence for Project Aries," *Centre for Research in Experimental Space Science* (Apr. 1981).
Niederwald et al., "IAD of Oxide Coatings at Low Temperature: A Comparison of Processes based on Different Ion Sources," *Proc. SPIE* vol. 3133 (1997) pp. 205-213.
Okada et al., "Microwave Determination of the Coefficient of Dissociative Recombination of $Ar_2$ in AR Afterglow," *J. Phys. D: Appl. Phys.* vol. 26 (1993) 1680-1686.
Ono et al., "Effect of Annealing on Mechanical Properties of Electron-Irradiated Aluminum single Crystals at 23° $K^1$," *Applied Physics Letters* vol. 7, No. 7 (Oct. 1, 1965) pp. 191.
Pawlewicz et al., "Low-Energy High-Flux Reactive Ion Assisted Deposition of Oxide Optical Coatings: Performance, Durability, Stability and Scalability," *SPIE Proceedings 2261* (1994) 1-12.
Perry et al., "The Application of the Helicon Source of Plasma Processing" *Journal of Vacuum Science & Technology B: Microelectronics and Nanometer Structures* vol. 9, No. 2 (Mar. 1991) 310-317. Abstract printed from Online Journal Publishing Service.
Persson "Inertia-Controlled Ambipolar Diffusion," *The Physics of Fluids* vol. 5, No. 12 (Dec. 1962) 1625-1632.
Persson "Brush Cathode Plasma—A Well-Behaved Plasma," *Journal of Applied Physics* vol. 36, No. 10 (Oct. 1965) 3086-3094.
Phelps "Role of Molecular Ions, Metastable Molecules, and Resonance Radiation in the Breakdown of Rare Gases," *The Physical Review* vol. 117, No. 3 (Feb. 1, 1960) 619-632.
Piejak et al., "A Simple Analysis of an Inductive RF Discharge," *Plasma Source, Science and Technology*, vol. 1, No. 3 (1992) pp. 179-186.
Piejak et al., "The Electric Field and Current Density in a Low-Pressure Inductive Discharge Measured with Different B-dot Probes," *J. Appl. Phys.* vol. 81, No. 8 (Apr. 15, 1997) 3416-3421.
Popov "Characteristics of Electron Cyclotron Resonance Plasma Sources," *Journal of Vacuum Science & Technology A: Vacuum, Surfaces, and Films* vol. 7, No. 3 (May 1989) 894-898. Abstract printed from Online Journal Publishing Service.
Rapp et al., "Charge Exchange Between Gaseous Ions and Atoms," *The Journal of Chemical Physics* vol. 37, No. 11 (Dec. 1, 1962) 2631-2645.
Resonance Ltd., *Operation Manual for Vacuum Monochromator Model #VS2FS* (Sep. 1993).
Resonance Ltd., *Operation Manual for RF Powered Line Sources* (undated).
Sato, "Plasma Density Profile and Electron Temperature in Discharge Positive Columns at Intermediate Pressures: Examination of Ingold's Approximation," *J. Phys. D: Appl. Phys.* vol. 26 (1993) 1687-1690.
Schiffer et al., "Negative-Oxygen-Ion Detection by a Crossed-Beam Photodetachment Technique," *Plasma Sources Sci. Technol.* vol. 4 (1995) 345-352.
Self et al., "Static Theory of a Discharge Column at Intermediate Pressures," *The Physics of Fluids* vol. 9, No. 12 (Dec. 1966) 2486-2492.
Sirghi et al., "Nonlocal Particle Loss Effects on the Electron Kinetics in a Direct Current Helium Diffusion-Controlled Positive Column," *Phys. Plasmas* vol. 4, No. 4 (Apr. 1997) 1160-1165.
Smirnov et al., "Resonance Charge Transfer in Inert Gases," *Soviet Physics-Technical Physics* vol. 10, No. (1965) 83-92.
Smith, "Section 9.6: Plasma Chemistry," *Thin-Film Deposition: Principles and Practice* McGraw-Hill-New York: (1995) pp. 616-617.
Stodiek et al., "Plasma Confinement in Low-Density C Stellarator Discharges," *Proceedings of a Conference on Plasma Physics and Controlled Nuclear Fusion Research* CN-21/120, International Atomic Energy Agency (1965) pp. 687-703.

(56) References Cited

OTHER PUBLICATIONS

Stowers et al., "Review of Precision Surface Generating Processes and Their Potential Application to the Fabrication of Large Optical Components*," *SPIE Advances in Fabrication and Metrology for Optics and Large Optics*, vol. 966 (1988) pp. 62-73.
Suchel et al., "Properties of $TiO_2$ and $SiO_2$ Films Prepared by Ion-Assisted Deposition Using a Gridless End-Hall Ion Source," *Society of Vacuum Coaters: 36th Annual Technical Conference Proceedings* (1993) pp. 82-87.
Sugai et al., "Diagnostics and Control of Radicals in an Inductively Coupled Etching Reactor," *Journal of Vacuum Science & Technology A., Vac. Surf. Films*, vol. 13, No. 3, Pt. 1 (May/Jun. 1995) pp. 887-893.
Toader "On the Constricted Neon Positive Column," *J. Phys. D: Appl. Phys.*, vol. 28 (1995) 75-80.
Tuszewski et al., "Composition of the Oxygen Plasmas from Two Inductively Coupled Sources," *J. Vac. Sci. Technol. A* vol. 13, No. 3 (May/Jun. 1995) 839-842.
Tuszewski "An Electronegative Inductive Discharge Instability," *J. Appl. Phys.* vol. 79, No. 12 (Jun. 15, 1996) 8967-8975.
Tuszewski, "Enhanced Radio Frequency Field Penetration in an Inductively Coupled Plasma," *Physical Review Letters* vol. 77, No. 7 (Aug. 12, 1996) 1286-1289.
Tuszewski, "Inductive Electron Heating Revisited*," *Phys. Plasmas* vol. 4, No. 5 (May 1997) 1922-1928.
Vahedi et al., "Analytic Model of the Ion Angular Distribution in a Collisional Sheath," *Journal of Vacuum Science & Technology A: Vacuum, Surfaces, and Films* vol. 11, No. 4 (Jul. 1993) 1275-1282. Abstract printed from Online Journal Publishing Service.
Vahedi "Modeling and Simulation of RF Discharges Used for Plasma Processing," *Dissertation Submitted in Partial Satisfaction of Requirement for Ph.D. in Electrical Engineering and Computer Science from University of California at Berkeley* (1993).
Vialle et al., "Kinetics of $O(^1S)$ and $O(^1D)$ Metastable Atoms in a DC Oxygen Glow Discharge," *J. Phys. D: Appl. Phys.*, vol. 24 (1991) pp. 301-308.
Viček, "A Collisional-Rediative Model Applicable to Argon Discharges Over a Wide Range of Conditions: Formulation and Basic Data," *J. App. D: Appl. Phys.*, vol. 22 (1989) 623-631.
Whitmer et al., "Effects of a Velocity-Dependent Collision Frequency on Wave-Plasma Interactions," *The Physics of Fluids*, vol. 9 (Apr. 1966) 768-773.
Yoshikawa et al., "Ion Heating in the C Stellarator," *Plasma Physics and Controlled Nuclear Fusion Research: Proceedings of Second Conference of International Atomic Energy Agency*, (1965) 925-939.
Zarowin et al., "Quasi-CW, High Numerical Aperture, Inductively Excited Ion Laser*," *Applied Physics Letters* vol. 11, No. 2 (Jul. 15, 1967) pp. 47-48.
Zarowin, "Relation Between the RF Discharge Parameters and Plasma Etch Rates, Selectivity, and Anisotropy," *J. Vac. Science Technology* (Oct.-Dec. 1984) pp. 1537-1549.
Zarowin, "A Theory of Plasma-Assisted Chemical Vapor Transport Processes," *J. Appl. Phys.* vol. 57, No. 3 (Feb. 1985) pp. 929-942.
Zarowin et al., Rapid, Non-Mechanical, Damage Free Figuring of Optical Surfaces Using Plasma Assisted Chemical Etching (PACE): Part II Theory & Process Control, *SPIE vol. 966 Advances in Fabrication and Metrology for Optics and Large Optics* (1988) pp. 91-97.
Zarowin et al., "Rapid, Non-Contact Damage Free Shaping of Optical & Other Surfaces With Plasma Assisted Chemical Etching," *IEEE 43d Annual Symposium on Frequency Control* (1989) pp. 623-626.
Zarowin, "A Comparison Using Surface Evolution Theory of the Smoothing and Figuring of Optics by Plasma Assisted Chemical Etching and Ion Milling," *SPIE vol. 1618 Large Optics II* (1991) pp. 22-26.
Zhang et al., "Modification of the Density Profile in a Toroidal Plasma Source Using a Bias Electric Field," *Appl. Phys. Lett.*, vol. 70, No. 23 (Jun. 9, 1997) pp. 3090-3092.
Zhelyazkov et al., "Axial Structure of Low-Pressure High-Frequency Discharges Sustained by Traveling Electromagnetic Surface Waves," *Physics Reports-Review Section of Physics Letters*, (1995) pp. 79-201.
Hirose et al., "STOR II A Tokamak for Plasma Heating Studies," Plasma Physics Laboratory, University of Saskatchewan, Apr. 1981, pp. 11-14.
Osram ECG-SPOT Brochure, Feb. 1997, pp. 1-12.
Cayless et al., "*Lamps and Lighting*," Third Edition, pp. 280-286.
"International Lighting Review, Induction Lighting," *The Global Lighting Magazine*, Apr. 1996.
"The Advanced Energy PE 2500 W, 100 kHz Generator with Load Matching User Manual," Sep. 1989.
Kassakian et al., *Principles of Power Electronics*, 1991, Chapter 1, pp. 1-8.
Lieberman et al., *Principles of Plasma Discharges and Material Processing*; Chapter 12 "Inductive Discharges," pp. 387-389.
Benesch, *Breakdown in the Pretext Tokamak*, "Chapter Two—The Machine," Jun. 1981, pp. 15-16.
Kogan et al., "Research into Potential for Creating Transformer Type Plasmatrons," *Teplofizika Vysokikh Temperatur*, vol. 31, No. 1, 1993, pp. 1-8.
Complaint for Declaratory Judgment of Non-Infringement, filed in the United States District Court for the District of Colorado, by Advanced Energy Industries, Inc., dated Apr. 3, 2003.
Complaint, filed in the United States District Court for the District of Delaware, by MKS Instruments, Inc. and Applied Science and Technology, Inc., dated May 14, 2003.
Answer, filed in the United States District Court for the District of Delaware, by Advanced Energy Industries, Inc., dated Dec. 10, 2003.
Amended Complaint and Jury Demand, filed in the United States District Court for the District of Colorado, by Advanced Energy Industries, Inc., dated Dec. 15, 2003.
Memorandum Opinion, US District Court for the District of Delaware, dated Feb. 12, 2004.
Order, US District Court for the District of Delaware, dated Feb. 12, 2004.
Heckman et al., Advanced Energy Marketing Materials, "The Evolution of RF Power Delivery in Plasma Processing," (Copyright 1998) pp. 1-8.
Advanced Energy Marketing Materials, "Introducing Power Supplies and Plasma Systems," (Copyright 1992) pp. 1-8.
Advanced Energy Marketing Materials, "Impedance Matching," (Copyright 1992) pp. 1-8.
Advanced Energy Industries, Inc., Presentation "Advances in 13.56 MHz Applications" by Knipp (date unknown) pp. 1-32.
*CRC Handbook of Chemistry and Physics* (1979-1980) pp. E-60.
Eckert, "The Hundred Year History of Induction Discharges," *Proceedings of the Second Annual International Conference of Plasma Chemistry and Technology* (Nov. 12-13, 1984) pp. 171-202.
Foutz, "Switching-Mode Power Supply Design" (Jan. 17, 2001) pp. 1-3.
Gale et al., "Characterization of a Micromachined Electrical Field-Flow Fractionation (µEFFF) System" (no date) pp. 1-6.
"An Intelligent Solution to RF Load-Power Variability," vol. 2, No. 3, $3^{rd}$ Quarter (1995) pp. 1-8.
Lenk, "Switching Power-Supply Basics," *Simplified Design of Switching Power Supplies* (1995) pp. 1.
"Linear Circuit Analysis," *Electrical Engineering Handbook*, (Copyright 1993) pp. 85.
Massey, "Fabric antennas for mobile telephony integrated within clothing" (no date) pp. 1-4.
Pressman, *Switching Power Supply Design*, (no date) pp. xvii.
"Principals and Techniques," *Electrical Engineers' Handbook*, (Copyright 1997) pp. 3.40-3.41.
*Remote Plasma Source* Chapter 2, (Mar. 2001) pp. 2-1-2-6.
Ulanov et al., "Study of the Transformer-Coupled Induction Toroidal Discharge for Development of Plasma-Chemical Reactors and New Light Sources," (date unknown) pp. 1-19.
Talanov et al., "Measurement of the absolute penetration depth and surface resistance of superconductors and normal metals with the variable spacing parallel plate resonator," *Review of Scientific Instruments*, vol. 71, No. 5 (May 2000) pp. 2136-2146.
Memorandum Opinion, US District Court for the District of Delaware, dated Apr. 26, 2002.

(56) References Cited

OTHER PUBLICATIONS

Order, US District Court for the District of Delaware, dated Apr. 26, 2002.
Memorandum Opinion, US District Court for the District of Delaware, dated May 14, 2002.
Order, US District Court for the District of Delaware, dated May 13, 2002.
Didenko et al., "An Intense Source of Optical Emission from Electrodeless Low-Frequency Discharge in Vapors of Sulfur and Mercury," *Doklady Physics*, vol. 45, No. 4 (2000) pp. 155-156.
Goldsborough et al., "RF Induction Excitation of CW Visible Laser Transitions in Ionized Gases," *Appl. Phys. Let.*, vol. 8, No. 6 (Mar. 15, 1966) pp. 137-139.
Herman, "Plasma-Sprayed Coatings," *Scientific American* (Sep. 1988) pp. 112-117.
*Journal of Technical Physics*, vol. 33, No. 10 (1963) pp. 1169-1172. (Russian).
Smith, "Thin-Film Deposition: Principles and Practice," *McGraw Hill, Boston*, (1995) pp. 520-525.
Vasil'kovskaya et al., "Some Problems of Experimental Investigation of Vortex Flows of Gas in a Cylindrical Channel and Toroidal Chamber," *News of the Siberian Division of the USSR Academy of Science*, vol. 8, No. 2 (1982).
Zarowin, "New Visible CW Laser Lines in Singly-Ionized Chlorine," *Appl. Phys. Let.*, vol. 9, No. 6 (Sep. 15, 1966) pp. 241-242.
Zarowin et al., "A Novel Approach to the Design of a Transistorized Inverter-Converter operating at Higher than Audio Frequencies," *IEEE Journal of Solid-State Circuits*, vol. SC-7. No. 4 (Aug. 1972) pp. 292-296.

METHOD AND APPARATUS FOR PROCESSING METAL BEARING GASES

RELATED APPLICATIONS

This application is a continuation of Ser. No. 12/511,785, filed on Jul. 29, 2009, now U.S. Pat. No. 8,124,906, which is a divisional application of Ser. No. 11/269,917, filed on Nov. 8, 2005, now U.S. Pat. No. 7,569,790, which is a continuation-in-part of Ser. No. 10/837,912, filed on May 3, 2004, now U.S. Pat. No. 7,166,816, which is a continuation of Ser. No. 09/804,650, filed on Mar. 12, 2001, now U.S. Pat. No. 6,815,633, which is a continuation-in-part of Ser. No. 09/774,165, filed on Jan. 26, 2001, now U.S. Pat. No. 6,924,455, which is a continuation-in-part of Ser. No. 09/659,881, filed on Sep. 12, 2000, now U.S. Pat. No. 6,486,431, which is a continuation of Ser. No. 08/883,281, filed on Jun. 26, 1997, now U.S. Pat. No. 6,150,628, the entire disclosures of which are incorporated herein by reference. In addition, this application claims priority to U.S. Provisional Patent Application Ser. No. 60/625,838, filed on Nov. 8, 2004.

FIELD OF THE INVENTION

This invention relates generally to the field of generating activated gas containing ions, free radicals, atoms and molecules and to apparatus for and methods of processing materials with activated gas.

BACKGROUND OF THE INVENTION

Plasma discharges can be used to excite gases to produce activated gases containing ions, free radicals, atoms and molecules. Activated gases are used for numerous industrial and scientific applications including processing solid materials such as semiconductor wafers, powders, and other gases. The parameters of the plasma and the conditions of the exposure of the plasma to the material being processed vary widely depending on the application.

For example, some applications require the use of ions with low kinetic energy (i.e. a few electron volts) because the material being processed is sensitive to damage. Other applications, such as anisotropic etching or planarized dielectric deposition, require the use of ions with high kinetic energy. Still other applications, such as reactive ion beam etching, require precise control of the ion energy.

Some applications require direct exposure of the material being processed to a high density plasma. One such application is generating ion-activated chemical reactions. Other such applications include etching of and depositing material into high aspect ratio structures. Other applications require shielding the material being processed from the plasma because the material is sensitive to damage caused by ions or because the process has high selectivity requirements.

Plasmas can be generated in various ways including DC discharge, radio frequency (RF) discharge, and microwave discharge. DC discharges are achieved by applying a potential between two electrodes in a gas. RF discharges are achieved either by electrostatically or inductively coupling energy from a power supply into a plasma. Parallel plates are typically used for electrostatically coupling energy into a plasma. Induction coils are typically used for inducing current into the plasma. Microwave discharges are achieved by directly coupling microwave energy through a microwave-passing window into a discharge chamber containing a gas. Microwave discharges are advantageous because they can be used to support a wide range of discharge conditions, including highly ionized electron cyclotron resonant (ECR) plasmas.

RF discharges and DC discharges inherently produce high energy ions and, therefore, are often used to generate plasmas for applications where the material being processed is in direct contact with the plasma. Microwave discharges produce dense, low ion energy plasmas and, therefore, are often used to produce streams of activated gas for "downstream" processing. Microwave discharges are also useful for applications where it is desirable to generate ions at low energy and then accelerate the ions to the process surface with an applied potential.

However, microwave and inductively coupled plasma sources require expensive and complex power delivery systems. These plasma sources require precision RF or microwave power generators and complex matching networks to match the impedance of the generator to the plasma source. In addition, precision instrumentation is usually required to ascertain and control the actual power reaching the plasma.

RF inductively coupled plasmas are particularly useful for generating large area plasmas for such applications as semiconductor wafer processing. However, prior art RF inductively coupled plasmas are not purely inductive because the drive currents are only weakly coupled to the plasma. Consequently, RF inductively coupled plasmas are inefficient and require the use of high voltages on the drive coils. The high voltages produce high electrostatic fields that cause high energy ion bombardment of reactor surfaces. The ion bombardment deteriorates the reactor and can contaminate the process chamber and the material being processed. The ion bombardment can also cause damage to the material being processed.

Faraday shields have been used in inductively coupled plasma sources to contain the high electrostatic fields. However, because of the relatively weak coupling of the drive coil currents to the plasma, large eddy currents form in the shields resulting in substantial power dissipation. The cost, complexity, and reduced power efficiency make the use of Faraday shields unattractive.

SUMMARY OF THE INVENTION

The invention, in one embodiment, features an apparatus for processing metal bearing gases. The apparatus includes an inlet and a plasma chamber for containing a metal bearing gas. The apparatus also includes a transformer having a primary winding and a magnetic core surrounding a portion of the plasma chamber. The apparatus also includes a solid state switching power supply comprising one or more switching semiconductor devices coupled to a voltage supply and having an output coupled to the primary winding, the switching power supply driving current in the primary winding, the current inducing a potential inside the chamber that directly forms a toroidal plasma which completes a secondary circuit of the transformer and which reacts with the metal bearing gas.

In one embodiment, at least a second gas (e.g., one or more of $H_2$, $H_2O$ and $O_2$) is provided to the plasma chamber via the inlet. Reactions of the metal-containing gases with one or more second gases can convert the metal-containing gases to a solid form such as metals, metal oxides, or metal nitrides. Alternatively, the reactions may convert the metal-containing gases to different gaseous compounds that can be utilized or treated subsequently. The apparatus can include a device for collecting a metallic material, a metal oxide material or a metal nitride material produced by the interaction of the plasma with the metal bearing gas. The device can be, for example, a filter, a particle trap, a cyclone trap and an electrostatic trap. In some embodiments, the device is located external to the plasma chamber. In some embodiments, a portion of the plasma chamber (e.g., a replaceable component of the plasma chamber) collects a metallic material, a metal oxide material or a metal nitride material produced by the interaction of the plasma with the metal bearing gas.

The metal bearing gas can include fluorine. The metal bearing gas can be, for example, $WF_6$, $UF_6$, $SF_4$ or metal organics. The plasma chamber can include at least one of a metallic material, coated metallic material or dielectric material. In some embodiments, the plasma chamber includes a ceramic or quartz material.

The invention, in another aspect, features an apparatus for processing metal bearing gases. The apparatus includes an inlet and a plasma chamber for containing a metal bearing gas. The plasma chamber includes an electrically conductive material and at least one dielectric region that forms an electrical discontinuity in the plasma chamber. The apparatus also includes a transformer having a primary winding and a magnetic core surrounding a portion of the plasma chamber. The apparatus also includes a power supply having an output electrically connected to the primary winding, the power supply driving current in the primary winding, the current inducing a potential inside the chamber that forms a toroidal plasma which completes a secondary circuit of the transformer and which reacts with the metal bearing gas.

The invention, in another aspect, relates to a method for processing metal bearing gases. The method involves receiving a metal bearing gas in a plasma chamber at pressure via an inlet. The method also involves forming a toroidal plasma inside the plasma chamber, by passing current, generated by a solid state switching power supply comprising one or more switching semiconductor devices, through a primary winding of a transformer having a magnetic core surrounding a portion of the plasma chamber, the toroidal plasma reacting with the metal bearing gas to produce at least one of a metallic material, a metal oxide material or a metal nitride material.

The method also can involve providing at least a second gas to the plasma chamber. The method also can involve producing a metal oxide material or a metal nitride material by the interaction of the plasma, the metal bearing gas and the second gas. The method also can involve outputting the at least one of a metallic material, a metal oxide material or a metal nitride material from the plasma chamber.

The method also can involve collecting the at least one of a metallic material, a metal oxide material or a metal nitride material produced by the interaction of the plasma with the metal bearing gas. The method also can involve filtering the at least one of a metallic material, a metal oxide material or a metal nitride material from an output of the plasma chamber.

The invention, in another aspect, features an apparatus for processing metal bearing gases. The apparatus includes a means for receiving a metal bearing gas in a plasma chamber at pressure via an inlet. The apparatus also includes a means for forming a toroidal plasma inside the plasma chamber, by passing current, generated by a solid state switching power supply comprising one or more switching semiconductor devices, through a primary winding of a transformer having a magnetic core surrounding a portion of the plasma chamber, the toroidal plasma reacting with the metal bearing gas to produce at least one of a metallic material, a metal oxide material or a metal nitride material.

The invention, in another aspect, features a plasma source that forms a toroidal plasma that reacts with a metal bearing gas or a silicon bearing gas. The plasma source can be a low power plasma source and/or operate at low voltage levels.

The invention, in another aspect, features a plasma source that includes more than one high permeability magnetic core that surround the plasma chamber. In one embodiment, separate switching power supplies are coupled to the primary winding of each of the high permeability magnetic cores. In another embodiment, a single power supply is coupled to the primary winding of each of the high permeability magnetic cores.

In one embodiment, the plasma chamber includes imbedded cooling channels for passing a fluid that controls the temperature of the plasma chamber. In another embodiment, the plasma chamber is formed of quartz and is thermally bonded to a fluid cooled supporting structure. In another embodiment, the plasma chamber is formed of anodized aluminum and is thermally bonded to a fluid cooled supporting structure.

In one embodiment, the plasma chamber is formed of metal. Metal plasma chambers include multiple dielectric regions that prevent induced current flow from forming in the plasma chamber. In one embodiment, the metal plasma chamber is segmented with multiple dielectric gaps to reduce the potential difference between the plasma and the metal plasma chamber, thereby distributing the plasma loop voltage across multiple dielectric gaps. The segmented plasma chamber facilitates operating the plasma source at relatively high loop voltages, while reducing or eliminating the plasma channel surface erosion. In another embodiment, circuit elements are used to control the voltage distribution across the metal plasma chamber.

In one embodiment, the power supply of the high power source includes a voltage regulator circuit that provides a stable DC bus voltage that allows the user to precisely control the total power supplied to the plasma. In one embodiment, the high power toroidal plasma source of the present invention includes an apparatus for reliably igniting the plasma.

The invention, in another aspect, features a high power toroidal plasma source. The high power toroidal plasma source, in one embodiment of the present invention, has numerous advantages. The high power plasma source generates a relatively high power plasma with higher operating voltages that has increased dissociation rates and that allow a wider operating pressure range. Also, the high power plasma source has precise process control. In addition, the high power plasma source has relatively low plasma chamber surface erosion.

Accordingly, the present invention features apparatus for dissociating or activating gases that includes a plasma chamber comprising a gas. In one embodiment, the plasma chamber may comprise a portion of an outer surface of a process chamber. In one embodiment, the plasma chamber comprises a dielectric material. For example, the dielectric material may be quartz. The dielectric material may be thermally bonded to a supporting structure. The supporting structure may include cooling channels that transport cooling fluid.

In another embodiment, the plasma chamber is formed of an electrically conductive material and at least one dielectric region that forms an electrical discontinuity in the conductive material. The electrically conductive material may be aluminum and the aluminum may be anodized. The electrically conductive material may be segmented with at least two dielectric gaps. The dielectric gaps reduce the potential difference between the plasma and the metal plasma chamber, thereby distributing the plasma loop voltage across the at least two dielectric gaps. A voltage divider circuit may be electrically coupled across the at least two dielectric gaps to distribute the plasma loop voltage across the at least two dielectric gaps.

The apparatus includes a first and second transformer. The first transformer has a first magnetic core surrounding a first portion of the plasma chamber and has a first primary winding. The second transformer has a second magnetic core that surrounds a second portion of the plasma chamber and has a second primary winding. The apparatus also includes first and second solid state AC switching power supply.

The first solid state AC switching power supply includes one or more switching semiconductor devices that is coupled to a first voltage supply and has a first output that is coupled to the first primary winding. The second solid state AC switching power supply includes one or more switching semiconductor devices that is coupled to a second voltage supply and has a second output that is coupled to the second primary winding. The voltage supplies may include a voltage regulator circuit.

The one or more switching semiconductor devices may be switching transistors. In one embodiment, the output of the one or more switching semiconductor devices is directly coupled to the primary winding. The solid state AC switching power supplies may be substantially identical. Also, the solid state AC switching power supplies may comprise a single power supply unit.

In operation, the first solid state AC switching power supply drives a first AC current in the first primary winding. The second solid state AC switching power supply drives a second AC current in the second primary winding. The first AC current and the second AC current induce a combined AC potential inside the plasma chamber that directly forms a toroidal plasma that completes a secondary circuit of the transformer and that dissociates the gas.

In one embodiment, the apparatus includes an apparatus to assist in igniting the plasma. In one embodiment, an electrode is positioned in the plasma chamber that generates free charges that assist the ignition of the plasma in the plasma chamber. In another embodiment, an electrode may be capacitively coupled externally from the dielectric plasma chamber to assist in ignition in the plasma chamber. In another embodiment, the apparatus includes a secondary winding that resonates with the primary winding and raises the voltage in the plasma chamber to assist ignition of the plasma in the plasma chamber. In another embodiment, an ultraviolet light source is optically coupled to the plasma chamber. The ultraviolet light source generates free changes that assist the ignition of the plasma in the plasma chamber.

The present invention also features a method for dissociating or activating gases. The method includes confining a gas in a plasma chamber at a pressure. A first and a second current are generated with a first and a second solid state AC switching power supply. The first and the second current induce a combined AC potential inside the plasma chamber by passing the first current though a first primary winding having a first magnetic core surrounding a first portion of the plasma chamber, and by passing the second current though a second primary winding having a second magnetic core surrounding a second portion of the plasma chamber. The combined induced AC potential directly forms a toroidal plasma that completes a secondary circuit of the transformer and dissociates the gas. The method may be used for cleaning process chambers.

The method may include regulating the current generated with the first and the second solid state AC switching power supply. The method may also include providing an initial ionization event in the plasma chamber. In addition, the method may include measuring electrical parameters of the primary and secondary and adjusting a magnitude of the current generated by the first and the second solid state AC switching power supply in response to the measured electrical parameters.

BRIEF DESCRIPTION OF THE DRAWINGS

This invention is described with particularity in the appended claims. The above and further advantages of this invention may be better understood by referring to the following description taken in conjunction with the accompanying drawings, in which:

DETAILED DESCRIPTION

Figure 1:
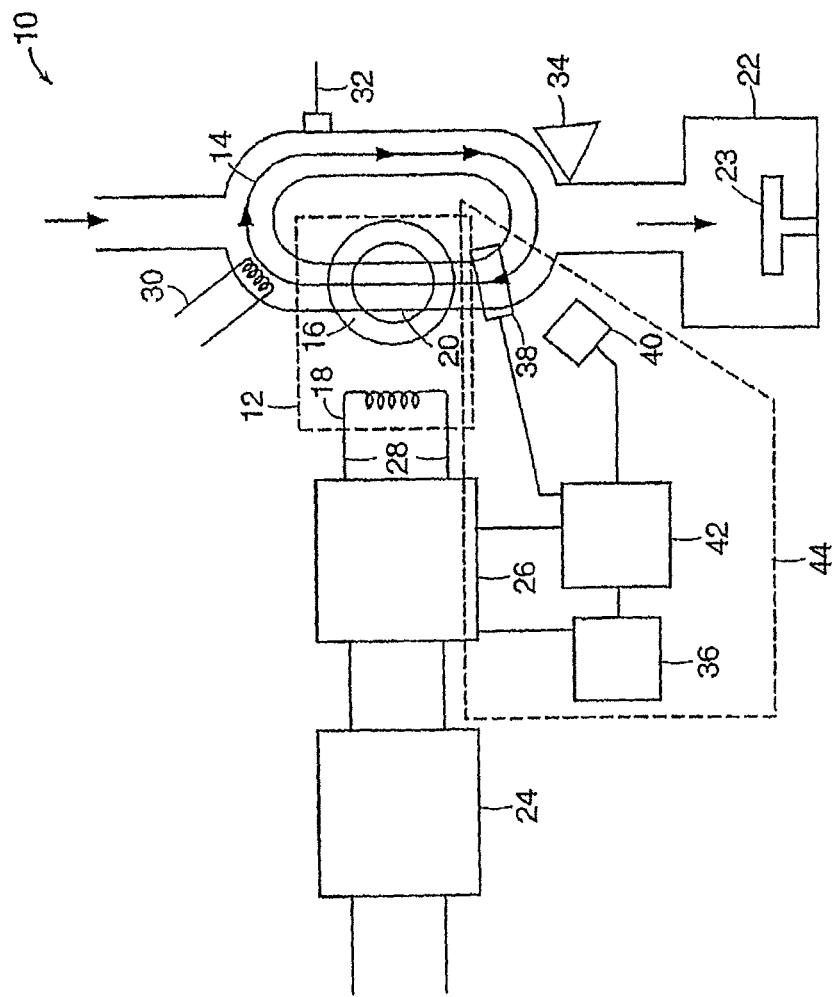
FIG. 1 is a schematic representation of a toroidal low-field plasma source for producing activated gases that embodies the invention.

FIG. 1 is a schematic representation of a toroidal low-field plasma source 10 for producing activated gases that embodies the invention. The source 10 includes a power transformer 12 that couples electromagnetic energy into a plasma 14. The power transformer 12 includes a high permeability magnetic core 16, a primary coil 18, and a plasma chamber 20 that contains the plasma 14, which allows the plasma 14 to form a secondary circuit of the transformer 12. The power transformer 12 can include additional magnetic cores and primary coils (not shown) that form additional secondary circuits.

One or more sides of the plasma chamber 20 are exposed to a process chamber 22 to allow charged particles and activated gases generated by the plasma 14 to be in direct contact with a material to be processed (not shown). A sample holder 23 may be positioned in the process chamber 22 to support the material to be processed. The material to be processed may be biased relative to the potential of the plasma.

The materials used in the internal surface of the plasma chamber 20 and the vacuum elements that connect the output of the plasma chamber 20 to the process chamber 22 must be carefully chosen, especially if the plasma source will be used to generate chemically reactive species. Materials are selected to meet several requirements. One requirement of the materials is that the creation of contamination that results from corrosion or deterioration of the material caused by interaction of the materials with the process gases should be minimized. Another requirement of the materials is that they have minimal erosion when exposed to process gases. Another requirement of the materials is that they should minimize recombination and deactivation of the reactive gas, thus maximizing reactant delivery to the process chamber.

Anodized aluminum has some advantages for semiconductor processing applications. One advantage is that anodized aluminum can be grown directly on an underlying aluminum base through an electroplating process. The resulting film has excellent adherence properties. Another advantage is that anodized aluminum has a thermal conductivity that is approximately 15 times greater than the thermal conductivity of quartz. Therefore, the inside surface of plasma chambers that are formed with anodized aluminum will remain relatively cool, even with significant incident power density.

Another advantage is that anodized aluminum is chemically inert to many atomic species (F, O, Cl, etc.) as long as there is no or only low-energy ion bombardment present. Anodized aluminum is particularly advantageous for fluorine chemistries because it has a low recombination coefficient for atomic fluorine. Also, anodized aluminum is a material that is commonly used and accepted for semiconductor materials processing applications.

Quartz also has some advantages for semiconductor processing applications. Quartz is available in extremely high purity and is commonly used and accepted in the semiconductor industry. Also, quartz is stable with numerous reactive species including O, H, N, Cl, and Br. In particular, quartz has a low surface recombination coefficient for atomic oxygen and hydrogen. Also, quartz has a low thermal coefficient of expansion and has relatively high resistance to thermal shock. In addition, quartz has a high softening and melting point and, therefore, it is relatively easy to form a process chamber from quartz.

Fluoropolymers also have some advantages for semiconductor processing applications. Examples of some fluoropolymers are PTFE, PFE, PFA, FEP, and Teflon™. The recombination rate for many fluoropolymers is relatively low. Fluoropolymers also are relatively inert to most atomic species including atomic fluorine and atomic oxygen. In addition, the purity of fluoropolymers is relatively high and fluoropolymers are available in both bulk form (tube, sheet, etc.) and in thin film form.

In some embodiments, fluoropolymers, however, can be eroded by ions in the plasma. Also, the maximum operating temperature that fluoropolymers can tolerate is significantly less than the maximum temperature that quartz can tolerate. In addition, the thermal conductivity of fluoropolymers is relatively low. Therefore, in some embodiments, fluoropolymers are most useful for constructing the transport sections outside of the plasma chamber.

A voltage supply 24, which may be a line voltage supply or a bus voltage supply, is directly coupled to a switching circuit 26 containing one or more switching semiconductor devices. The one or more switching semiconductor devices may be switching transistors. The circuit may be a solid state switching power supply. An output 28 of the switching circuit 26 may be directly coupled to the primary winding 18 of the transformer 12.

The toroidal low field plasma source 10 may include an apparatus for generating free charges that provides an initial ionization event that ignites a plasma in the plasma chamber 20 as described herein. A noble gas, such as argon, may also be inserted into the plasma chamber 20 to reduce the voltage required to ignite a plasma. Free charges can be generated in numerous ways as described herein. For example, free charges can be generated by applying a short high voltage pulse to an electrode inside of the plasma chamber 20. Also, free charges can be generated by applying a short high voltage pulse directly to the primary coil 18. In another embodiment, a high electric voltage signal may be applied to an electrode, located outside of a dielectric plasma chamber 20 but capacitively coupled to the plasma volume, to generate free charges to assist ignition in the plasma chamber 20.

In another embodiment, an ultraviolet light source 34 is used to generate free charges that provide an initial ionization event, which ignites a plasma in the plasma chamber 20. The ultraviolet (UV) light source 34 is optically coupled to the plasma chamber 20. The UV light source 34 may be optically coupled to the plasma channel through an optically transparent window. The UV light source 34 may either be a continuous wave (CW) light source or a pulsed light source depending on the duty cycle of the plasma source.

The toroidal low field plasma source 10 may also include a measuring circuit 36 for measuring electrical parameters of the primary winding 18. Electrical parameters of the primary winding 18 include the current driving the primary winding 18, the voltage across the primary winding 18, the bus or line voltage that is generated by the voltage supply 24, the average power in the primary winding 18, and the peak power in the primary winding 18. The electric parameters of the primary winding may be continuously monitored.

The plasma source 10 may also include an apparatus for measuring electrical and optical parameters of the plasma 14 itself. For example, the source 10 may include a current probe 38 that is positioned around the plasma chamber 20 to measure the plasma current flowing in secondary of the transformer 12. Also, the voltage on the plasma secondary can be measured, for example, by positioning a secondary winding on the magnetic core parallel to the plasma 14. Alternatively, the electric power applied to the plasma may be determined from measurements of the AC line voltage and current and from known losses in the electric circuit.

The plasma source 10 may also include an optical detector 40 for measuring the optical emission from the plasma 14. The electric and optical parameters of the plasma 14 may be continuously monitored. In addition, the plasma source 10 may include a power control circuit 42 that accepts data from at least one of the current probe 38, the power detector 40, and the switching circuit 26 and then adjusts the power in the plasma by adjusting the current in the primary winding 18.

In operation, a gas is bled into the plasma chamber 20 until a pressure that is substantially between 1 mtorr and 100 torr is reached. In some embodiments, a gas is bled into the chamber 20 until a pressure that is between about 0.1 mTorr and about 1,000 Torr is reached. The gas may comprise a noble gas, a reactive gas or a mixture of at least one noble gas and at least one reactive gas. The switching circuit 26 containing switching semiconductor devices that supply a current to the primary winding 18 that induces a potential inside the plasma chamber 20.

The magnitude of the induced potential depends on the magnetic field produced by the magnetic core 16 and the frequency at which the switching semiconductor devices operate according to Faraday's law of induction. An ionization event that forms the plasma may be initiated in the chamber 20. The ionization event may be the application of a voltage pulse to the primary winding or to the electrode 30 positioned in the chamber 20 as described herein. Alternatively, the ionization event may be exposing the inside of the plasma chamber 20 to ultraviolet radiation.

Once the gas is ionized, a plasma is formed in the plasma chamber 20 that completes a secondary circuit of the transformer 12. The shape of the plasma 14 can vary from circular to non-circular (oval, etc.). In one embodiment, the diameter of a circular plasma 14 may vary from approximately 0.5 to 2.0 inches depending upon the operating conditions. Changing the diameter of the plasma 14 changes the gas flow dynamics and the plasma impedance and allows the plasma source to be optimized for different operating ranges (i.e. different power levels, pressures ranges, gases, and gas flow rates).

Changing the shape of a non-circular plasma 14 allows the flow patterns for neutral species and flow patters of the plasma itself to be separately optimized for different operating regimes. In one embodiment, the ratio of the maximum to the minimum dimension may vary from about 1 (i.e. a circular cross section) to 10 depending upon the particular application.

The electric field of the plasma may be substantially between about 1-200 V/cm. If only noble gases are present in the plasma chamber 20, the electric fields in the plasma 14 may be as low as 1 volt/cm. If, however, electronegative gases are present in the plasma chamber 20, then the electric fields in the plasma 14 are considerably higher. In some embodiments, operating the plasma source 10 with low electric fields in the plasma 14 is desirable because a low potential difference between the plasma 14 and the chamber 20 will substantially reduce erosion of the chamber 20 caused by energetic ions. This will substantially reduce the resulting contamination to the material being processed. Reducing erosion of the chamber 20 is not required in some embodiments.

The power delivered to the plasma can be accurately controlled by a feedback loop 44 that comprises the power control circuit 42, the measuring circuit 36 for measuring electrical parameters of the primary winding 18 and the switching circuit 26 containing one or more switching semiconductor devices. In addition, the feedback loop 44 may include the current probe 38 and optical detector 40.

In one preferred embodiment, the power control circuit 42 measures the power in the plasma using the measuring circuit 36 for measuring electrical parameters of the primary winding 18. The power control circuit 42 compares the resulting measurement to a predetermined value representing a desired operating condition and then adjusts one or more parameters of the switching circuit 26 to control the power delivered to the plasma. The one or more parameters of switching circuit 26 include, for example, voltage and current amplitude, frequency, pulse width, and relative phase of the drive pulses to the one or more switching semiconductor devices.

In another preferred embodiment, the power control circuit 42 measures the power in the plasma using the current probe 38 or the optical detector 40. The power control circuit 42 then compares the measurement to a predetermined value representing a desired operating condition and then adjusts one or more parameters of the switching circuit 26 to control the power delivered to the plasma.

In one embodiment, the plasma source 10 may include protection circuits to ensure that the plasma source 10 is not damaged either through abnormal environmental conditions or through abnormal usage. The temperature of the plasma source 10 may be monitored at numerous locations to ensure that an appropriate amount of cooling fluid is flowing and that an abnormally high amount of power is not being dissipated in the source. For example, the temperature of the mounting blocks for the switching devices, the plasma chamber 20 itself, and the magnetic core may be monitored. Also, the current flowing though the FET devices may be monitored. If the current exceeds predetermined values the plasma source 10 may be shut down, thereby protecting the switching devices against possible damage.

The plasma source 10 is advantageous because its conversion efficiency of line power into power absorbed by the plasma is very high compared with prior art plasma sources. This is because the switching circuit 26 containing one or more switching semiconductor devices that supplies the current to the primary winding 18 is highly efficient. The conversion efficiency may be substantially greater than 90%. The plasma source 10 is also advantageous because it does not require the use of conventional impedance matching networks or conventional RF power generators. This greatly reduces the cost and increases the reliability of the plasma source.

In addition, the plasma source 10 is advantageous because it operates with low electric fields in the plasma chamber 20. Low electric fields are desirable because a low potential difference between the plasma and the chamber will substantially reduce energetic ion bombardment within the plasma chamber 20. Reducing energetic ion bombardment in the plasma chamber 20 is desirable because it minimizes the production of contaminating materials within the plasma chamber 20, especially when chemically reactive gases are used. For example, when fluorine based gases, such as NF3 and CF4/O2, are used in a plasma source 10 of the present invention having a plasma chamber formed from a fluorine resistant material, no or minimal erosion of the chamber was observed after extended exposure to the low ion temperature fluorine plasma.

The plasma source 10 is useful for processing numerous materials, such as solid surfaces, powders, and gases. The plasma source 10 is particularly useful for cleaning process chambers in semiconductor processing equipment, such as thin film deposition and etching systems. The plasma source 10 is also particularly useful for providing an ion source for ion implantation and ion milling systems.

In addition, the plasma source 10 is particularly useful for generating activated gas for semiconductor processing. The plasma source can be used to etch numerous materials, such as silicon, silicon dioxide, silicon nitride, aluminum, molybdenum, tungsten and organic materials like photoresists, polyimades and other polymeric materials. The plasma source 10 can be used for plasma enhanced deposition of numerous thin films materials, such as diamond films, silicon dioxide, silicon nitride, and aluminum nitride.

In addition, the plasma source 10 can be used to generate reactive gases, such as atomic fluorine, atomic chlorine, atomic hydrogen, atomic bromine, and atomic oxygen. Such reactive gases are useful for reducing, converting, stabilizing or passivating various oxides, such as silicon dioxide, tin oxide, zinc oxide and indium-tin oxide. Specific applications include fluxless soldering, removal of silicon dioxide from a silicon surface, passivation of silicon surfaces prior to wafer processing, and surface cleaning of various metal and dielectric materials such as copper, silicon, and silicon oxides.

Other applications of the plasma source 10 include modification of surface properties of polymers, metals, ceramics and papers. Also, the plasma source 10 may be used for abatement of environmentally hazardous gases including fluorine containing compounds, such as CF4, NF3, C2F6, CHF3, SF6, and organic compounds such as dioxins and furans and other volatile organic compounds. In addition, the plasma source 10 may be used to generate high fluxes of atomic oxygen, atomic chlorine, or atomic fluorine for sterilization. Also, the plasma source 10 may be used to create an atmospheric pressure torch.

The plasma current and plasma current density of the plasma 14 generated by the plasma source 10 may be selected to optimize dissociation of particularly gases for particular applications. For example, the plasma current and plasma current density can be selected to optimize NF3 dissociation. NF3 is widely used as a source of fluorine for chamber cleaning and numerous other applications. NF3 is relatively expensive. Optimizing the plasma source 10 for high NF3 dissociation rates improves the gas utilization rate and reduces the overall cost of operating the system. In addition, increasing the dissociation rate of NF3 is desirable because it reduces the release of environmentally hazardous gases into the atmosphere.

The dissociation of NF3 is caused by collisions between the NF3 molecules and the electrons and hot gases in the plasma. The density of electrons in the plasma source is approximately proportional to the plasma current density. There exists an optimal range of plasma current densities that maximize the dissociating of NF3 molecules. In one embodiment, a toroidal plasma 14 having a length of approximately 40-60 cm, the optimal plasma current density for efficiently dissociating NF3 gas is between 5-20 A/cm$^2$. In one embodiment, a toroidal plasma 14 having a cross sectional area of 3-10 cm$^2$, this current density range corresponds to a total toroidal plasma current in the range of approximately 20-200 A.

Figure 2:
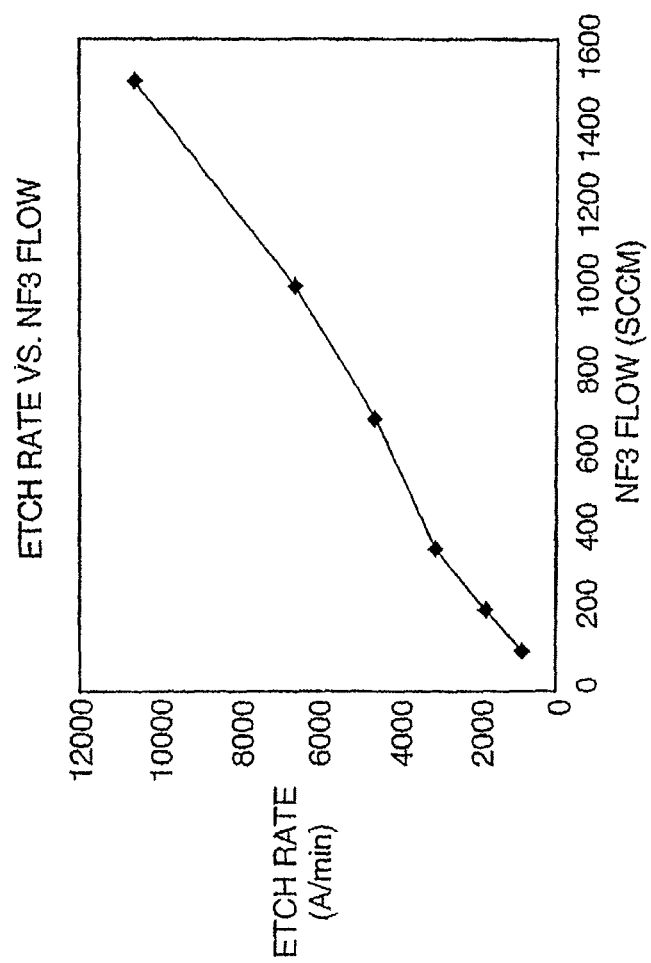
FIG. 2 illustrates a plot of etch rate of thermal silicon dioxide as a function of NF3 feed gas flow rate, using the toroidal low-field plasma source that embodies the invention.

FIG. 2 illustrates a plot of etch rate of thermal silicon dioxide as a function of NF3 feed gas flow rates using the toroidal low-field plasma source 10 that embodies the invention. The toroidal low-field plasma source 10 was configured as a downstream atomic fluorine source. The power was approximately 3.5 kW.

Figure 3:
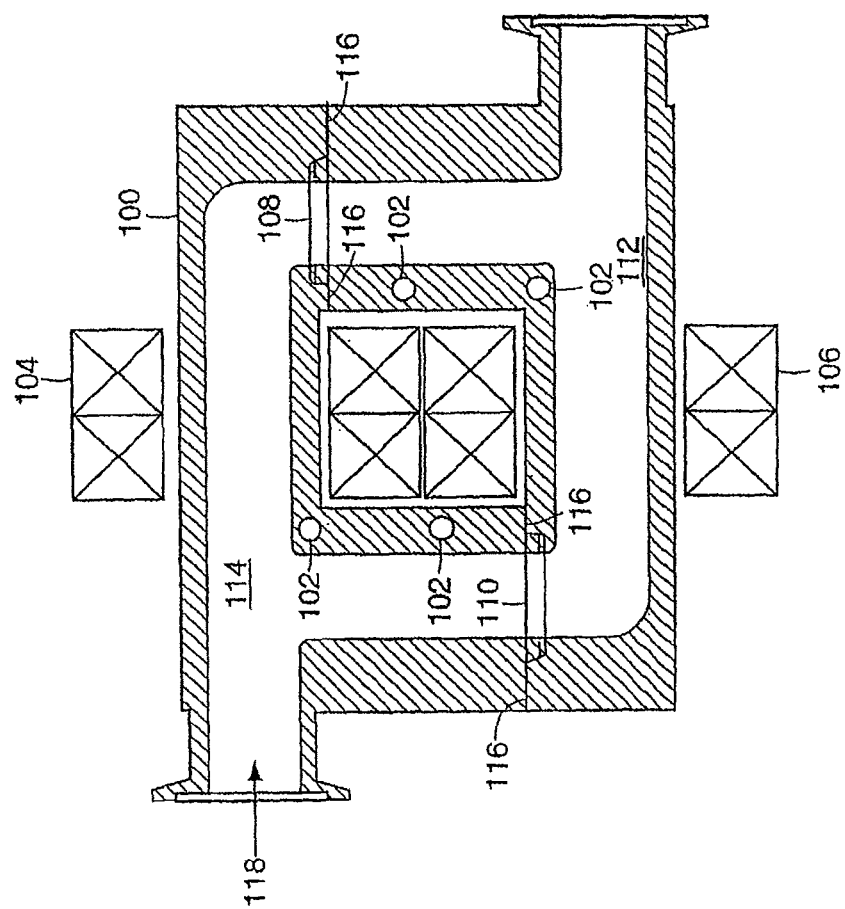
FIG. 3 is a schematic cross-sectional representation of a metallic plasma chamber that may be used with the toroidal low-field plasma source described in connection with FIG. 1.

FIG. 3 is a schematic cross-sectional representation of a metallic plasma chamber 100 that may be used with the toroidal low-field plasma source described in connection with FIG. 1. The plasma chamber 100 is formed from a metal such as aluminum, copper, nickel and steel. The plasma chamber 100 may also be formed from a coated metal such as anodized aluminum or nickel plated aluminum. The plasma chamber 100 includes imbedded cooling channels 102 for passing a fluid that controls the temperature of the plasma chamber 100.

As shown, a first 104 and a second high permeability magnetic core 106 surround the plasma chamber 100. The magnetic cores 104, 106 are part of the transformer 12 of FIG. 1. As described in connection with FIG. 1, each of the first 104 and the second core 106 induce a potential inside the chamber that forms a plasma which completes a secondary circuit of the transformer 12. Only one magnetic core is required to operate the toroidal low-field plasma source.

Applicants have discovered that an inductively-driven toroidal low-field plasma source can be made with a metallic plasma chamber. Prior art inductively coupled plasma sources use plasma chambers formed from dielectric material so as to prevent induced current flow from forming in the plasma chamber itself. The plasma chamber 100 of this invention includes at least one dielectric region that electrically isolates a portion of the plasma chamber 100 so that electrical continuity through the plasma chamber 100 is broken. The electrical isolation prevents induced current flow from forming in the plasma chamber itself.

The plasma chamber 100 includes a first 108 and a second dielectric region 110 that prevents induced current flow from forming in the plasma chamber 100. The dielectric regions 108, 110 electrically isolate the plasma chamber 100 into a first 112 and a second region 114. Each of the first 112 and the second region 114 is joined with a high vacuum seal to the dielectric regions 108, 110 to form the plasma chamber 100. The high vacuum seal may be comprised of an elastomer seal or may be formed by a permanent seal such as a brazed joint. In order to reduce contamination, the dielectric regions 108, 110 may be protected from the plasma. The dielectric regions 108, 110 may comprise a dielectric spacer separating mating surface 116 of the plasma chamber 100, or may be a dielectric coating on the mating surface 116.

In operation, a feed gas flows into an inlet 118. As described in connection with FIG. 1, each of the first 104 and the second magnetic core 106 induce a potential inside the plasma chamber 100 that forms a plasma which completes a secondary circuit of the transformer 12. Note that only one magnetic core is required to operate the toroidal low-field plasma source.

The use of metal or coated metal chambers in toroidal low-field plasma sources is advantageous because some metals are more highly resistant to certain chemicals commonly used in plasma processing, such as fluorine based gases. In addition, metal or coated metal chambers may have much higher thermal conductivity at much higher temperatures than dielectric chambers and, therefore, can generate much higher power plasmas. For example, anodized aluminum is particularly advantageous for some semiconductor processing applications as described herein.

Figure 4:
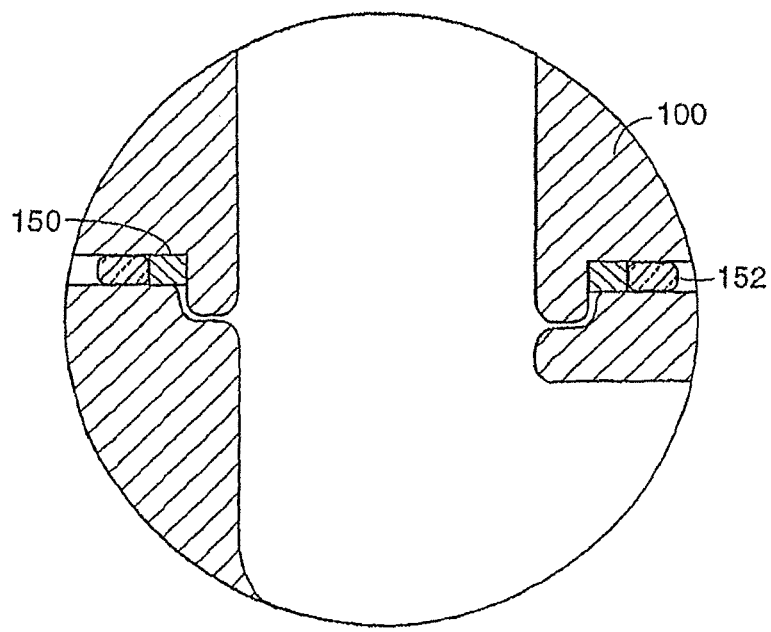
FIG. 4 is a schematic representation of a dielectric spacer suitable for the dielectric regions illustrated in FIG. 3 that prevent induced current flow from forming in the plasma chamber.

FIG. 4 is a schematic representation of a dielectric spacer 150 suitable for the dielectric regions illustrated in FIG. 3 that prevent induced current flow from forming in the plasma chamber. In this embodiment, a high vacuum seal 152 is formed outside the dielectric spacer 150. The dielectric region is protected from the plasma by protruded chamber wall 100.

Figure 5:
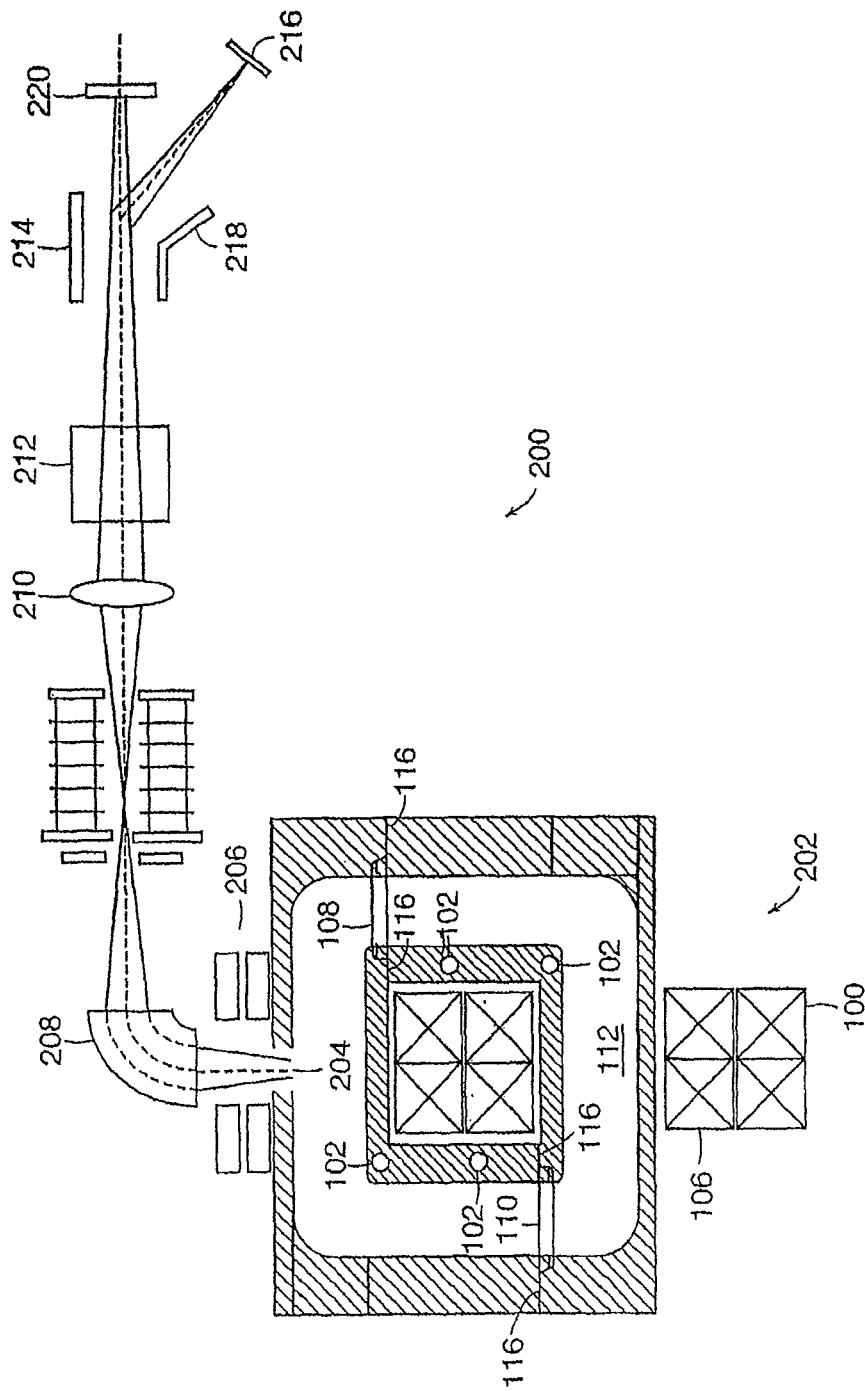
FIG. 5 is a schematic representation of a toroidal low-field ion beam source that embodies the invention and that is configured for high intensity ion beam processing.

FIG. 5 is a schematic representation of an ion beam source 200 including a toroidal low-field plasma generator that embodies the invention. The ion beam source 200 may be used for numerous ion beam processing applications including ion milling and ion implantation. The ion beam source 200 includes toroidal low field plasma source 202 comprising the metallic plasma chamber 100 described in connection with FIG. 3. The plasma chamber 100 includes a slit 204 for extracting ions generated by the plasma out of the chamber 100. Accelerating electrodes 206 accelerate the ions passing out of the chamber 100 with a predetermined electric field thereby forming an ion beam where the ions have a predetermined energy.

A mass-separating magnet 208 may be positioned in the path of the accelerated ions to select a desired ion species. A second set of accelerating electrodes may be used to accelerate the desired ion species to a predetermined high energy. An ion lens may be used to focus the high energy ion beam. A vertical 212 and a horizontal axis scanner 214 may be used to scan the ion beam across a sample 216. A deflector 218 may be used to separate the ion beam from any neutral particles so that the ion beam impacts the sample 216 and the neutral particles impact a neutral trap 220.

Figure 6:
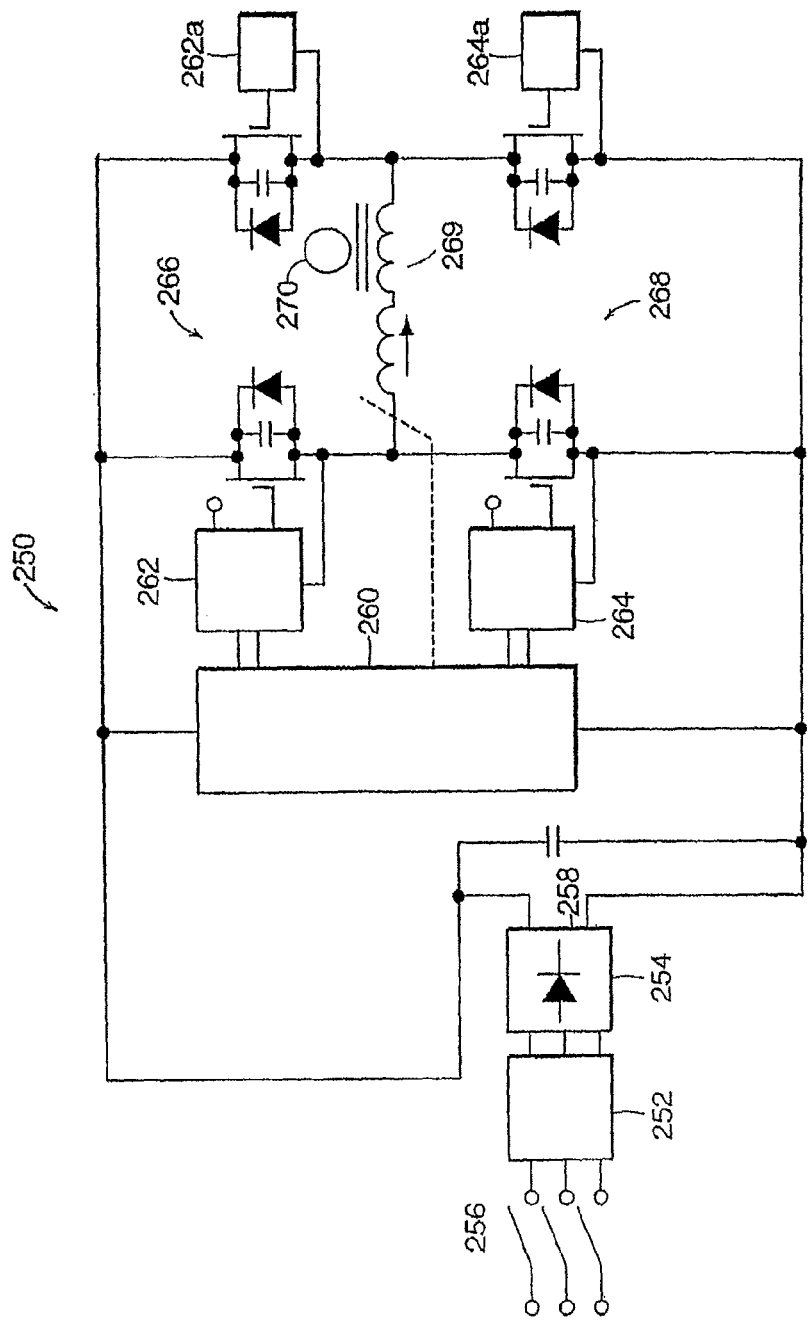
FIG. 6 is a schematic block diagram of a solid state switching power supply that includes the one or more switching semiconductor devices of FIG. 1.

FIG. 6 is a schematic block diagram of a solid state switching power supply 250 that includes the one or more switching semiconductor devices of FIG. 1. Applicants have discovered that switching semiconductor devices can be used to drive the primary winding of a power transformer that couples electromagnetic energy to a plasma so as to form a secondary circuit of the transformer.

The use of a switching power supply in toroidal low-field plasma source is advantageous because switching power supplies are much less expensive and are physically much smaller in volume and lighter in weight than the prior art RF and microwave power supplies used to power plasma sources. This is because switching power supplies do not require a line isolation circuit or an impedance matching network. Switching power supplies are also highly efficient.

The present invention can use any type of switching power supply configuration to drive current in the primary winding 18 (FIG. 1). For example, the switching power supply 250 may include a filter 252 and a rectifier circuit 254 that is coupled to a line voltage supply 256. An output 258 of the filter 252 and the rectifier circuit 254 produces a DC voltage that is typically several hundred volts. The output 258 is coupled to a current mode control circuit 260.

The current mode control circuit 260 is coupled to a first 262, 262a and a second isolation driver 264, 264a. The first 262, 262a and the second isolation driver 264, 264a drives a first 266 and a second pair of switching transistors 268. The switching transistors may be IGBT or FET devices. The output of the first 266 and the second pair of switching transistors 268 may have numerous waveforms including a sinusoidal waveform. The frequency of the waveforms depends upon the properties of the transformer. The output of the switching transistors is coupled by the primary winding and magnetic core 269 to the toroidal plasma 270, which forms the transformer secondary.

The current mode control circuit 260 may include a control circuit that receives a signal from the power control circuit 42 (FIG. 1) that is characterized by the electrical parameters of the primary winding 18 or optical properties of the plasma 14. The control circuit controls the duty cycle of the output waveform. In one embodiment, the control circuit averages the output waveform over a few switching cycles to eliminate noise and other fluctuations.

During plasma ignition abrupt changes in the output waveform may occur. Abrupt change usually occur when one or more resonant components are added or removed from the output circuit as described herein, thereby changing the circuit characteristic instantly. Abrupt changes may also occur when the plasma ignites or during circuit transition from the ignition mode to normal operation mode.

Control circuits that are optimized for normal operation may malfunction during such abrupt change. In one embodiment, the control circuit disables the power control circuit 42 (FIG. 1) and instructs the current mode control circuit 260 to produce signals that cause the switching transistors 266, 268 to generate an output waveform having a predetermined duty cycle during one or more phases of ignition. The predetermined duty cycles are selected so that the current through the switching transistors 266, 268 is sufficient, but never exceeds the current limit for that particular phase of ignition.

In one embodiment, the electric power generated by the solid state switching power supply 250 and applied to the primary winding is highly regulated. Many material processing applications, such as deposition, etching and photoresist removal require precise process control. Precise process control can be achieved by precisely controlling the density of the plasma and, therefore, the amount of chemical reactants in the process gas. The density of the plasma is proportional to the toroidal current flowing in the plasma. The toroidal current flowing in the plasma is nearly identical to the driving current in the primary winding because the magnetizing impedance of the transformer is usually much higher than the plasma impedance. In some embodiments, the flow rate and composition of the process gas is also highly regulated.

Figure 7A:
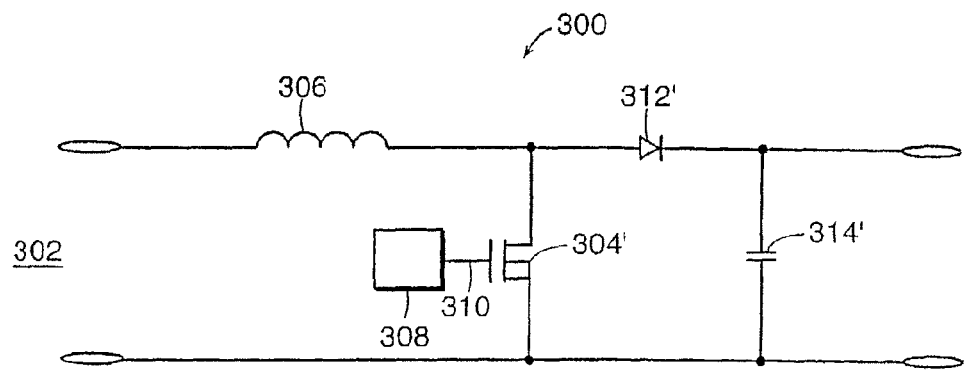
FIGS. 7a and b illustrate boost voltage regulator circuits that facilitate stable operation of the toroidal plasma source of an illustrative embodiment of the present invention.
Figure 7B:
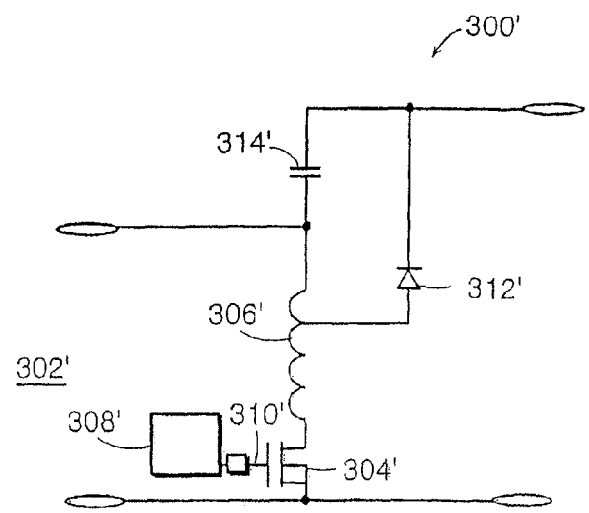

FIGS. 7a and b illustrate boost voltage regulator circuits 300, 300' that facilitate stable operation of the toroidal plasma source of the present invention. Variations in AC line voltage and frequency could alter the operating characteristics of the plasma source 10. The voltage regulator circuits 300 generate a stable DC bus voltage that is independent of the AC line voltage and frequency. The general operation of the two circuits is similar.

The boost voltage regulator circuits 300, 300' receive an unregulated DC voltage at an input 302, 302'. The unregulated DC voltage can be generated by rectifying the AC line voltage. A switching transistor 304, 304' is used to drive a current through an inductor 306, 306'. A high frequency driver circuit 308, 308' is coupled to the gate 310, 310' of the switching transistor 304, 304'. The driver circuit 308, 308' generates a control signal that controls the operation of the switching transistor 304, 304'. When the driver circuit 308, 308' drives the switching transistor 304, 304' to a conducting state, current passes through the switching transistor 304, 304' and the inductor 306, 306'. When the driver circuit 308, 308' drives the transistor 304, 304' to a non-conducting state, current that is flowing in the inductor 306, 306' continues to flow in the same direction. The current flows though a diode 312, 312' and charges a capacitor 314, 314'.

The voltage across the capacitor 314, 314' provides a stable DC bus voltage that has an amplitude that is greater than or equal to the amplitude of the AC line voltage. The control signal generated by the driver circuit 308, 308' adjusts the duty cycle of the switching transistor 304, 304' to provide a stable DC bus voltage. The driver circuit 308, 308' drives the switching transistor 304, 304' at a frequency of approximately 20 kHz-2 MHz. The high frequency switching transistor 304, 304' reduces the amount of energy that needs to be stored during each switching cycle. This reduces the size and the cost of the regulator.

Numerous other voltage regulation circuits may also be used. For example, a buck regulator can be used to provide a regulated voltage at or below the normal AC voltage value. Regulating the bus voltage has several advantages. One advantage is that regulating the bus voltage provides stable operation independent of AC line voltage and frequency variations. This is important because power in some areas of the world is unreliable. The voltage regulation circuit may also be used to control and adjust the DC bus voltage to the switching power supply. This allows the user to control the voltage and power supplied to the plasma. It also allows the user to match the changing plasma impedance conditions by varying the DC voltage to the switching power supply. Thus, regulating the bus voltage extends the operating range of the plasma source and allows more control over the process.

Figure 8A:
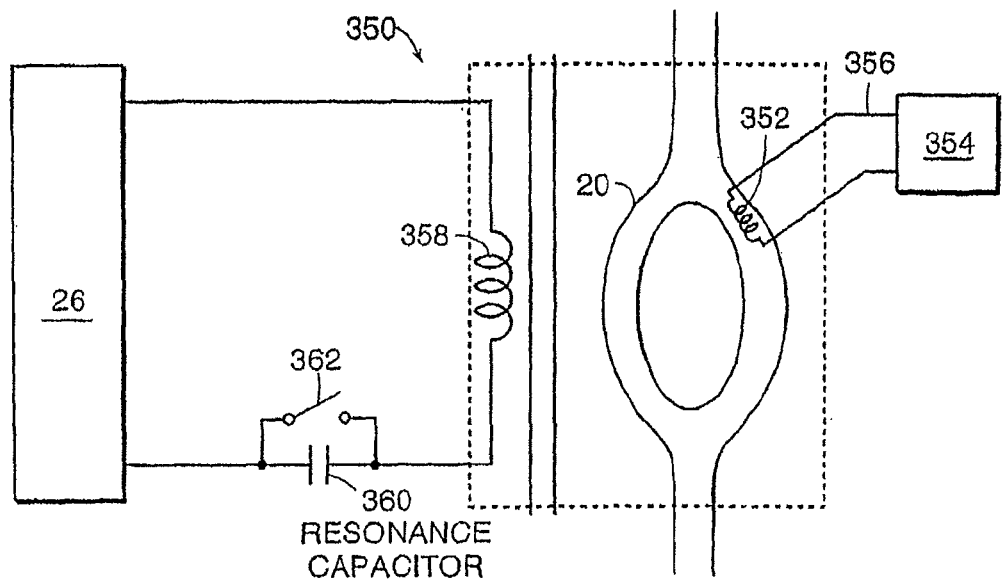
FIGS. 8a-c illustrate apparatus for igniting a plasma in the toroidal plasma source of an illustrative embodiment of the present invention.
Figure 8B:
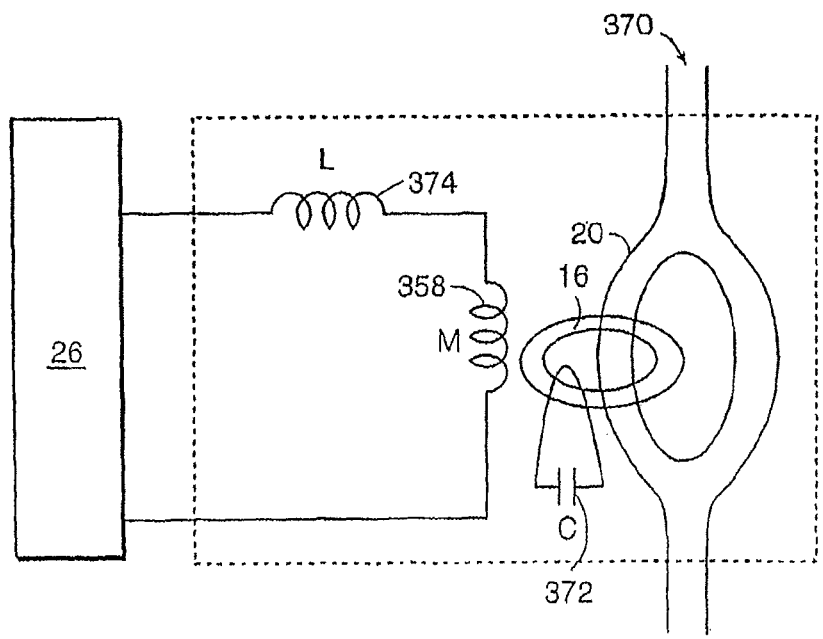
Figure 8C:
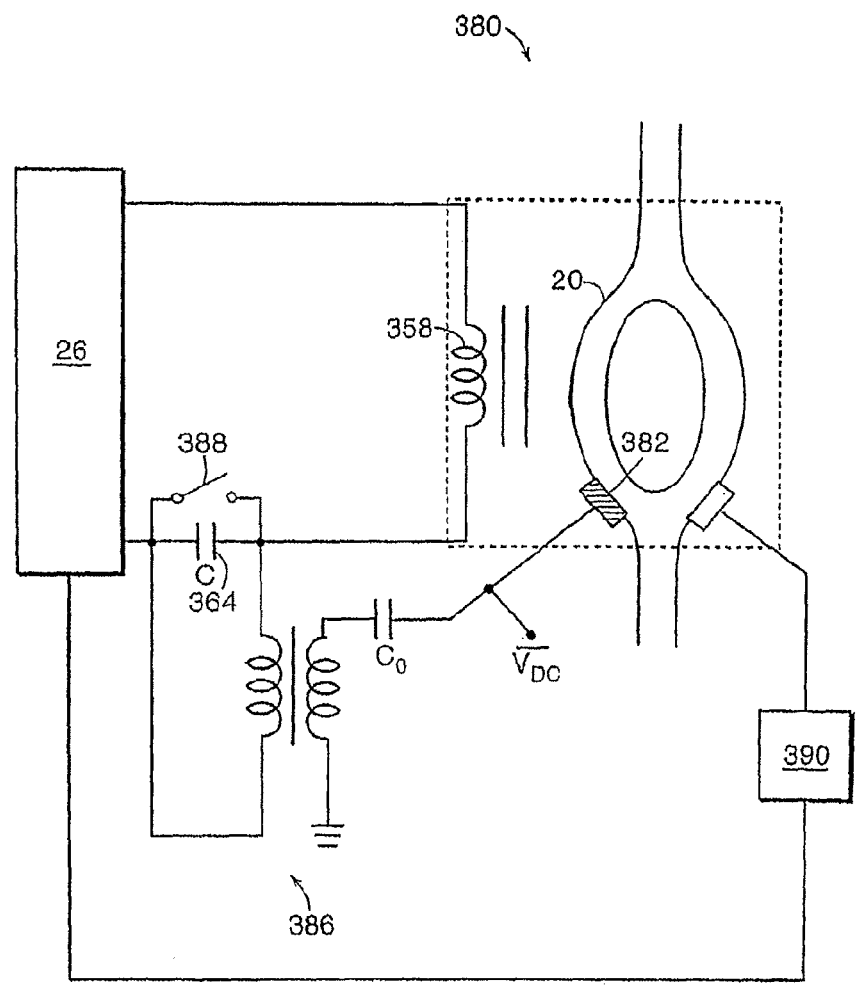

FIGS. 8a-c illustrate apparatus for igniting a plasma in the toroidal plasma source of the present invention. FIG. 8a illustrates a plasma source 350 that includes an electrode 352 for igniting the plasma that is positioned in the plasma chamber 20. The electrode 352 generates free charges that provide an initial ionization event, which ignites a plasma in the plasma chamber 20.

The selection of the electrode material will depend on specific applications. The electrode 352 may be formed of a metal, a coated metal, or a metal covered with a dielectric. One advantage of metal electrodes is that they may have lower breakdown voltages compared with dielectric-covered electrodes. Thus for a given applied voltage, ignition can be generally be achieved more easily and more reliably with bare metal electrodes. However, dielectric-covered electrodes are advantageous because many dielectrics are relatively chemically inert. This makes dielectric-covered electrodes more suitable for applications involving corrosive gases.

A high-voltage source 354 is electrically coupled to the electrode 352. In one embodiment, the high-voltage source 354 generates a short, high voltage electric pulse that is applied to the electrode 352. The high voltage electric pulse may have a voltage that is substantially between 1-10 kV. A lower DC voltage that is substantially between 100-1000 V may also be applied to the electrode 352 across a high resistance resistor.

The DC bias voltage that is applied to the electrode 352 collects electric charges generated by the background radiation during idle time. The magnitude of the voltage is selected so that it does not directly cause a gas breakdown. Rather, the magnitude is selected so that the electrode 352 collects charge that facilitates gas breakdown when the high voltage electric pulses arrive.

In another embodiment, one or more rectifying diodes may be connected to the output 356 of the high voltage source 354. The rectifying diodes cause the electrode 352 to be energized for a time duration that is longer than the duration of electric pulse itself This is because the diodes prevent the electrode 352 from being discharged after the high voltage pulse is terminated.

In a further embodiment, the high-voltage source 354 generates a CW RF voltage that is applied to the electrode 352. The CW RF voltage generates free charges that provide an initial ionization event, which ignites a plasma in the plasma chamber 20. The amplitude of the CW RF voltage may be between 1-10 kV. Appling a CW RF voltage to the electrode 352 is advantageous because it has a higher duty cycle compared with discrete electric pulses and, therefore, increases the probability of gas breakdown in operating conditions where it is difficult to ignite the plasma.

In yet another embodiment, a short, high voltage electric pulse is applied directly to the primary coil 358 to generate free charges that provide an initial ionization event, which ignites a plasma in the plasma chamber 20. A resonant circuit is used to increase the induced voltage in the plasma to approximately 1-10 times above the normal operation voltage. The resonant circuit may include one or more capacitors 360, which forms a LC circuit with the transformer at the switching frequency of the switching circuit 26.

The resonant circuit outputs a high resonance voltage on the primary winding 358 of the plasma source. After the plasma is ignited, the resonance capacitor 360 is removed from the primary circuit by bypassing it with an electric switch 362, bringing the voltage on the primary winding 358 back to the power voltage generated by the switching circuit 26.

FIG. 8b illustrates a plasma source 370 that includes a primary winding 358, an inductor 374 and a capacitor 372 which forms a resonating circuit to ignite a plasma in the plasma chamber 20. The resonant capacitor 372 is connected in a secondary circuit parallel to the plasma secondary on the transformer core. The capacitance is selected so that it is in resonance with a resonant inductor 374 and the magnetizing inductance M of the transformer at the frequency of the switching circuit 26.

In operation, before plasma is ignited, the impedance of the plasma is high, resulting in a high Q circuit that raises the voltage on the primary winding 358 of the transformer. After plasma ignition, the plasma impedance drops, damping the LC resonance circuit, thereby lowering the resonance voltage. With a finite plasma resistance R, the electric current flowing through the plasma in this circuit is determined by $V/Z_L$, the ratio of the switching circuit voltage and the impedance of the resonant inductance 374 at the switching frequency of the switching circuit 26. This current is independent of the plasma impedance R, making the plasma device a constant-current plasma source.

FIG. 8c illustrates a plasma source 380 that includes an electrode 382 that is electrically coupled to the plasma chamber 20. The electrode 382 is used to generate free charges that provide an initial ionization event, which ignites a plasma in the plasma chamber 20. The switching circuit 26 generates a CW RF voltage that is applied to the electrode 382.

A resonant capacitor 384 and an RF step-up transformer 386 are connected in series with the primary winding 358 of the transformer. During ignition, a bypass switch 388 is connected across the resonance capacitor 384 and is in the open position, thereby allowing the resonance capacitor 384 and the primary winding 358 to resonant at the frequency of the switching circuit 26. The step-up RF transformer 386 picks up the resonance voltage from the resonance capacitor 384, and applies a high RF voltage to the electrode 386.

A current-limiting capacitor may be connected between the electrode 382 and the step-up transformer 386 to limit the amount of power delivered to the electrode 382. A DC bias voltage may be applied to the electrode 382 through a resistor. The DC bias voltage collects some electric charge at the electrode 382, thereby assisting the gas breakdown when the RF high voltage arrives. After the plasma is ignited, the bypass switch 388 is closed to remove the resonant capacitor 384 and the step-up RF transformer 386 from the circuit.

The plasma source may also include a monitor and control circuit 390 for monitoring and controlling the ignition process. In one embodiment, the monitor and control circuit 390 first detects ignition of the plasma and then terminates the ignition sequence and switches the switching circuit 26 to a normal operation mode.

In another embodiment, the monitor and control circuit 390 monitors the ignition process at fixed, preset time intervals. The time interval may be a fraction of the typical ignition time. At the end of each time interval, the monitor and control circuit 390 measures the plasma light or the electric characteristics of the primary winding to determine if a plasma has been ignited. If a plasma ignition is detected, the monitor and control circuit 390 terminates the ignition process and returns the switching circuit 26 to a normal operation mode. If no plasma is detected, the monitor and control circuit 390 continues the ignition process into the next time interval. A fault is generated if no plasma is generated in the entire time duration allocated to the ignition process.

Figure 9:
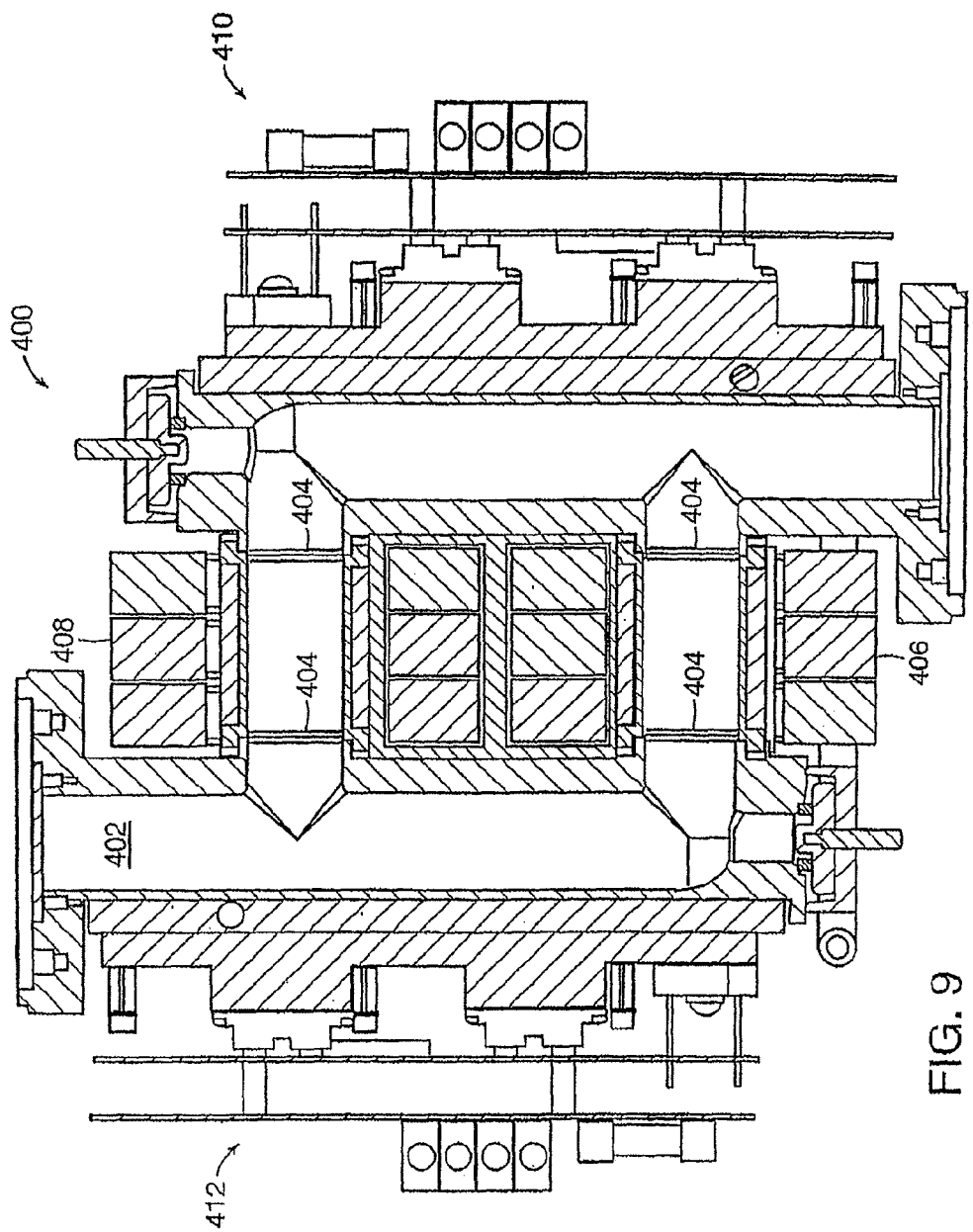
FIG. 9 illustrates a schematic cross-section of a high power toroidal low-field plasma source for producing activated gases according to an illustrative embodiment of the present invention.

FIG. 9 illustrates a schematic cross-section of a high power toroidal low-field plasma source 400 for producing activated gases. The plasma chamber 402 is formed from a metal, as described in connection with FIG. 3. In other embodiments, the plasma chamber 402 can be formed of numerous dielectric materials, such as quartz. The plasma chamber 402 includes dielectric regions 404 that prevent induced current flow from forming in the plasma chamber 402, as described in connection with FIG. 3. In one embodiment, the plasma chamber 402 also includes cooling structures to remove heat from the plasma chamber 402. The cooling structure may be fluid-cooled metal heat sinks thermally bonded to the plasma chamber 402. The cooling structure can also be imbedded cooling channels for passing a fluid that controls the temperature of the plasma chamber 402.

The high power plasma source 400 includes a first 406 and a second high permeability magnetic core 408 that surround the plasma chamber 402. In other embodiments, any number of magnetic cores may be used according to the present invention. In one embodiment, a first 410 and a second switching power supply 412 are coupled to a first and a second primary winding, respectively. The first 410 and the second power supply 412 may be synchronized. A common clock can be used to synchronize the operation of the first 410 and the second power supply 412. In another embodiment, a single power supply is coupled to the primary winding of each of the two high permeability magnetic cores.

In operation, the first power supply 410 drives a first AC current in the first primary winding, and the second power supply 412 drives a second AC current in the second primary winding. The first and second AC currents induce a combined AC potential inside the plasma chamber 402 that forms a plasma which completes a secondary circuit of the transformer. The voltage applied to the plasma is a combination of the voltage applied by the first power supply 410 and the second power supply 412. The plasma itself functions as the combiner for the two RF power sources.

The high power plasma source 400 has numerous advantages. One advantage is that the plasma source 400 is capable of generating higher powers in comparison to a single power supply plasma source. There are numerous advantages to using higher powers. One advantage is that higher powers increase the dissociation rates and allows a wider operating pressure range. For example, a toroidal plasma source according to the present invention that includes a single power supply can dissociate approximately 2 slm (standard liters per minute) flow rate of NF3, over a useful range of operating pressures. For some applications, however, it is desirable to use higher flow rates of NF3 or higher operating pressures. For these applications, higher RF power and RF voltages are required.

There are several methods of increasing the RF power and the RF voltage generated by a single switching power supply. One method of increasing the RF power and the RF voltage is to use a higher DC bus voltage. Another method is to use an RF resonant circuit. Both of these methods require using a switching power supply that has a higher output voltage or the output current rating. However, the current and voltage limitations on currently available switching transistors limit the achievable output voltage and output current of the switching power supply. It is, therefore, desirable to use multiple transformers and multiple switching power supplies to increase the RF power and the RF voltage that is provided to the plasma of the plasma source of the present invention.

Another advantage of the high power plasma source 400 is that the multiple power supply design is a relatively cost effective way to increase the power generated by the plasma source. Manufacturers can design and manufacture one power supply module and use that module in numerous models of the plasma source. For example, manufacturer can construct a basic plasma generator unit. Higher power plasma generator units can be manufactured by constructing a plasma source with multiple power supply modules. The power of the plasma approximately increases by a factor equal to the number of power supply modules.

Another advantage of the high power plasma source 400 is that minimal additional circuitry is required to combine the power generated by the multiple power supply modules. This feature improves reliability and reduces the cost to manufacture the unit.

The plasma source 400 may also be powered with a single power supply to generate higher electric voltages to the plasma in plasma chamber 402. The primary windings on the first 406 and second high permeability magnetic core 408 are connected in parallel to the switching power supply. The induced electric fields by these two magnetic cores are combined in the plasma channel, resulting in a voltage on the plasma that is twice the voltage of the switching power supply. In other embodiments, any number of magnetic cores and power supplies may be used to raise the voltage on the plasma according to the present invention.

The advantage of combining the voltage at plasma is that it allows applying a voltage on the plasma that is higher than the power supply voltage, even when the plasma is a single-turn secondary of the transformer.

Figure 10:
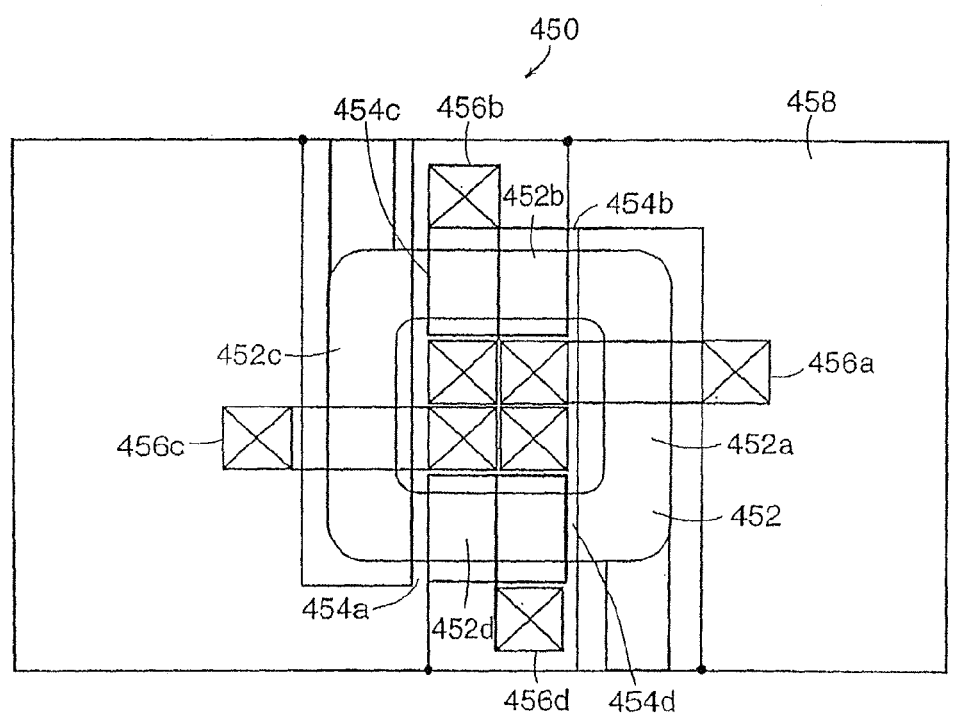
FIG. 10 illustrates a low-field toroidal plasma source according to an illustrative embodiment of the present invention that includes a segmented plasma chamber that has relatively low surface erosion.

FIG. 10 illustrates a low-field toroidal plasma source 450 according to the present invention that includes a segmented plasma chamber that has relatively low surface erosion. The presence of energetic ions in the plasma chamber causes erosion of the inner surface of the plasma chamber. The reactivity of the activated and ionized gases increases rapidly with their energy. This erosion can contaminate the process. Therefore, it is desirable to reduce the creation of energetic ions and atoms.

One advantage of the toroidal plasma source of one embodiment of the present invention is that relatively low electric fields can drive the plasma. Typical electric field intensity are under 10 V/cm. Consequently, the toroidal plasma source of one embodiment of the present invention generates plasmas with low ion energies. Therefore, the surface erosion due to ion bombardment even with highly corrosive gases is relatively low.

However, when the plasma source of the present invention includes a plasma chamber that is formed of metal or a coated-metal, electric fields are induced on the plasma chamber itself The voltage induced on the metal plasma chamber body appears at the ends of the metal chamber body across the dielectric region 110 (FIG. 3). Thus, there is a concentration of electric fields across the dielectric regions.

The plasma secondary, on the other hand, is a continuous medium. There is no corresponding abrupt potential change along the toroidal plasma. This disparity in electric potential between the metal plasma chamber and the plasma secondary creates high surface electric fields between the plasma and the metal chamber. The high surface electric fields create energetic ions that may cause surface erosion. The threshold energy for ion sputtering for most commonly used materials is approximately between 20-60 eV. Sputtering damage to the plasma channel surface may become significant when the potential difference across one dielectric gap exceeds 50-100 V.

The plasma source 450 of FIG. 10 includes a plasma chamber 452 that is segmented with multiple dielectric gaps to reduce the potential disparity between the plasma and the metal plasma chamber. In the embodiment shown in FIG. 10, the plasma chamber 452 is segmented into four parts by two dielectric gaps 454a, 454b, 454c and 454d. The plasma chamber 452 includes a first 452a, second 452b, third 452c, and fourth chamber 452d that is segmented by a first 454a, second 454b, third 454c and fourth dielectric gap 454d. In other embodiment, the plasma chamber 452 is segmented in any number of chambers.

The plasma source 450 includes a transformer core for at least one of the plasma chamber segments. In one embodiment, the plasma source 450 includes a transformer core for each of the plasma chamber segments. Thus, in the embodiment shown in FIG. 10, the plasma source 450 includes a first 456a, second 456b, third 456c, and fourth transformer core 456d. The chambers 452 are grounded to an enclosure 458 in a way that there is one of dielectric gaps 454a, 454b, 454c, 454d in a grounded path that circulates one quadrant of the returning magnetic flux contained in transformer core 456a, 456b, 456c or 456d. The voltage on each dielectric gap 454a, 454b, 454c, 454d is then a quarter of the voltage on the toroidal plasma. In other embodiments, the plasma loop voltage is distributed across any number of dielectric gaps.

Thus, the segmented plasma chamber 452 distributes the induced electric field on the plasma chamber 452. The use of multiple dielectric gaps allows operating a plasma source at significantly higher loop voltages, while reducing or eliminating the plasma channel surface erosion. In one embodiment, the electric voltage across each of dielectric regions 454a, 454b, 454c, 454d is reduced to ~100 V or lower. The distribution of loop voltage across multiple dielectric regions 454a, 454b, 454c, 454d has been shown to greatly reduce surface erosion.

In an alternative embodiment, circuit elements such as resistors and capacitors can be used as voltage dividers in the segmented plasma chamber 452. The use of circuit elements to control the voltage distribution has some advantages. One advantage of using circuit elements to control the voltage distribution, is that the voltage division across the dielectric gaps 454a, 454b, 454c, 454d can be controlled. Advantage of using circuit elements to control the voltage distribution is that the electric potential between the plasma and plasma chamber 452 can be minimized even if the dielectric gaps 454a, 454b, 454c, 454d are not evenly spaced.

Figure 11A:
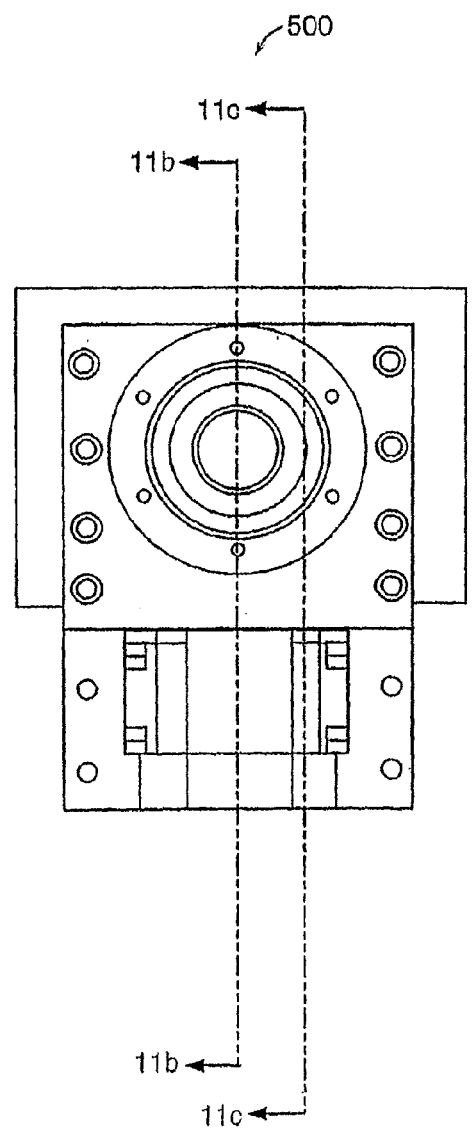
FIG. 11a illustrates a side view of one embodiment of the low-field toroidal plasma source according to an illustrative embodiment of the present invention that includes a quartz plasma chamber and a metal supporting structure.
Figure 11B:
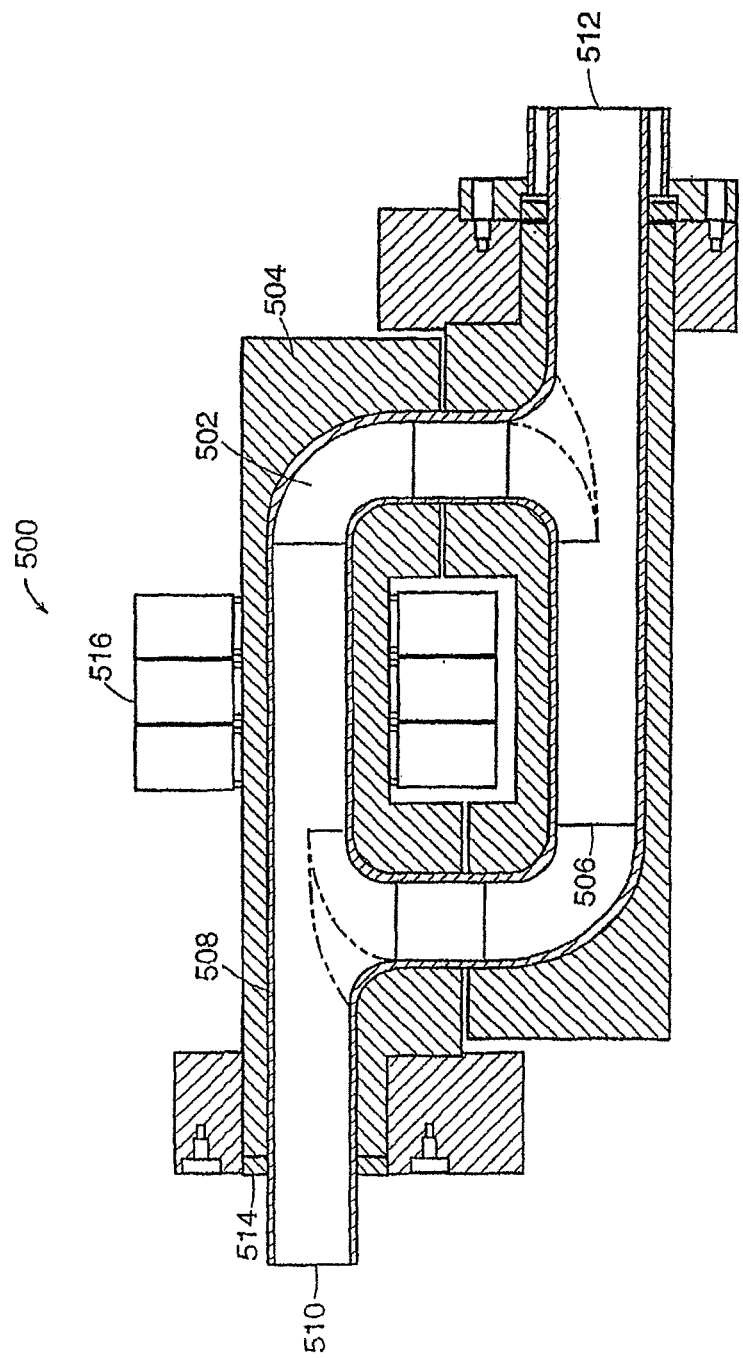
FIG. 11b illustrates a center cross section of the low-field toroidal plasma source according to an illustrative embodiment of the present invention that includes a quartz plasma chamber and a metal supporting structure.

FIG. 11a illustrates a side view of one embodiment of a low-field toroidal plasma source 500 according to the present invention that includes a quartz plasma chamber 502 and a metal supporting structure 504. FIG. 11b illustrates a center cross section of the low-field toroidal plasma source 500 according to the present invention that includes a quartz plasma chamber 502 and a metal supporting structure 504. The quartz plasma chamber 502 is formed in a toroidal geometry.

The quartz process chamber 502 is thermally bonded to a metal structure 504 that provides cooling and mechanical support. The metal support 504 includes at least one electric gap 506 that prevents induced current flow from forming in the plasma chamber. A high thermal conductivity bonding material 508 may be used to bond the quartz plasma chamber 502 to the metal structure 504. The bonding materials may have a low mechanical hardness to accommodate thermal mismatch between the quartz plasma chamber 502 and the support structure 504.

The plasma chamber 502 includes a gas inlet 510 and a gas outlet 512. In one embodiment, quartz flanges 514 are bonded to the quartz plasma chamber 502 near the gas inlet 510 and the gas outlet 512. Quartz flanges 514 are advantageous because in some applications o-ring seals cannot be used to directly seal the inlet and outlet tube. This is because quartz is not a good thermal conductor.

In some applications, a large amount of heat is carried by the process gas as it exits the plasma chamber 502 at the outlet 512. In these applications, the quartz tube at the outlet 512 of the plasma chamber 502 may experience temperatures that are too hot to use an o-ring to seal at the outlet 512. The bonded quartz flanges 514 move the vacuum seal surface away from the plasma chamber 502. One side of the quartz flange 514 is cooled through the thermal bonding material 508 and the metal structure 504. This provides a cooled surface for vacuum o-ring seal.

The plasma source 500 includes a high permeability magnetic core 516 that surrounds a portion of the plasma chamber 502. In other embodiments, at least two magnetic cores surround at least two portions of the plasma chamber 502. A primary coil surrounds the magnetic core 516. A circuit containing switching semiconductor devices supplies a current to the primary winding as described herein. The circuit induces a potential inside the plasma chamber 502 that couples electromagnetic energy to a plasma so as to form a secondary circuit of the transformer as described herein.

Figure 11C:
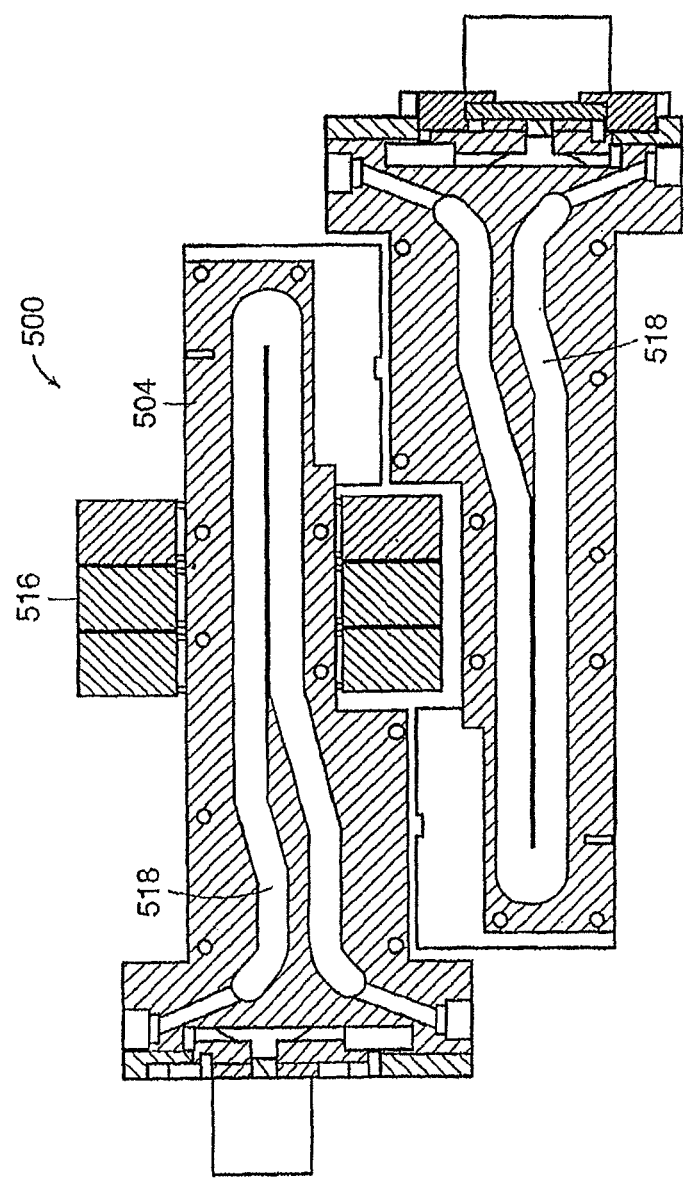
FIG. 11c illustrates an off center cross section of the low-field toroidal plasma source according to an illustrative embodiment of the present invention that includes a quartz plasma chamber and a metal supporting structure.

FIG. 11c illustrates an off center cross section of the low-field toroidal plasma source 500 according to the present invention that includes a quartz plasma chamber 502 and a metal supporting structure 504. The off center cross section illustrates the cooling channels 518 in the metal structure 504 that cool the quartz plasma chamber 502.

Figure 12:
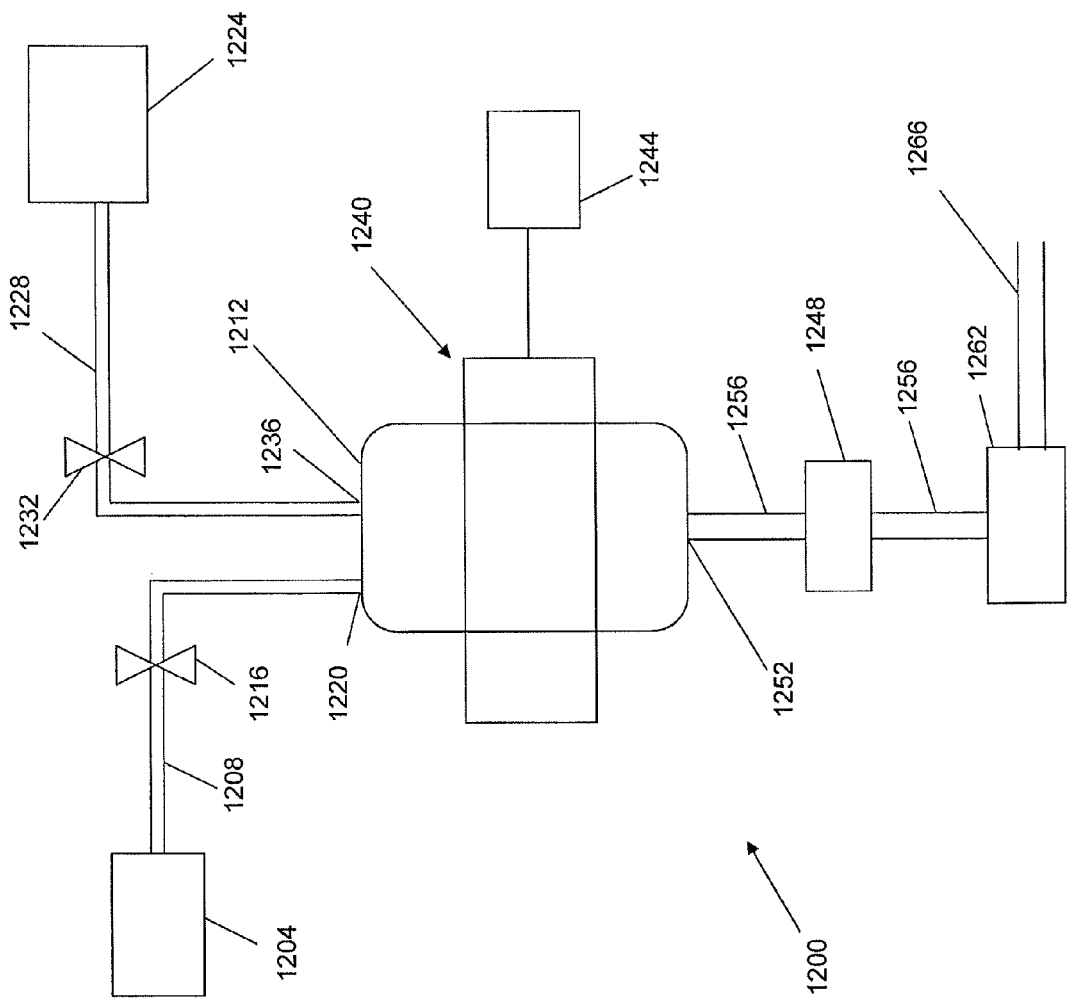
FIG. 12 is a partial schematic view of an apparatus for processing metal bearing gases that embodies the invention.

FIG. 12 is a schematic representation of an apparatus 1200 for processing metal bearing gases or silicon bearing gases that embodies the invention. The apparatus includes a gas source 1204 (e.g., a metal bearing gas source) connected via a gas line 1208 to a plasma chamber 1212. A valve 1216 controls the flow of a metal bearing gas (e.g., $WF_6$ and $UF_6$) from the metal bearing gas source 1204 through the gas line 1208 and into the plasma chamber 1212 via a gas inlet 1220. In one embodiment, the plasma chamber is, for example, the toroidal plasma chamber 100 of FIG. 3.

The apparatus also includes a plasma gas source 1224 connected via a gas line 1228 to the plasma chamber 1212. A valve 1232 controls the flow of plasma gas (e.g., $O_2$, $H_2$, $H_2O$, $N_2$, Ar, $NF_3$ and He) from the plasma gas source 1224 through the gas line 1228 and into the plasma chamber 1212 via a gas inlet 1236.

Various numbers and configurations of gas sources, gas lines and gas inlets are contemplated in alternative embodiments of the invention. By way of example, a single gas line can be used to deliver gases to the plasma chamber 1212 in one embodiment where multiple gas sources are operably connected to the gas line. In this embodiment, an operator can control a valve to select between each of the gas sources to provide an appropriate flow of a specific gas to the plasma chamber at an appropriate point in the process. In some embodiments, there are no valves and the gas sources, for example, control the flow of gas to the plasma chamber. Various types of gases are contemplated in alternative embodiments of the invention. By way of example, the gas source 1204 can provide, for example, a metal bearing gas or a silicon bearing gas.

The apparatus also includes a plasma generator 1240 that generates a plasma within the plasma chamber 1212. In this embodiment, the plasma generator 1240 is a toroidal low-field gas source, for example, the toroidal low-field gas source of FIG. 1. A controller 1244 controls the operation of the plasma generator 1240 which ignites and provides power to a toroidal plasma formed in the plasma chamber 1212, similarly as previously described herein. The plasma generator 1240 ignites the plasma gas provided by the plasma gas source 1224 to form the toroidal plasma.

The plasma chamber 1212 can be, for example, formed from a metallic material or can be formed from a dielectric material. In some embodiments, the plasma chamber 1212 includes at least one of a metallic material, coated metallic material or dielectric material. In some embodiments, the plasma chamber 1212 includes a ceramic material or a quartz material.

The interaction of the toroidal plasma and the metal bearing gas provided to the plasma chamber 1212 by the gas source 1204 produces another material. The material produced depends on a number of factors (e.g., power in the toroidal plasma, the type of metal bearing gas, and the types of plasma gases). In some embodiments, the toroidal plasma is formed from $H_2$ and reacts with the metal bearing gas to produce a metallic material comprising molecules of the metal atoms contained in the metal bearing gas. In some embodiments, $H_2O$ and $O_2$ are used to form the toroidal plasma which reacts with the metal bearing gas to produce a metallic oxide. In some embodiments, $N_2$ is used to form the toroidal plasma which reacts with the metal bearing gas to produce a metal nitride.

The apparatus 1200 also includes a collection device 1248 that collects the material produced by the interaction of the toroidal plasma with the metal bearing gas. The device 1248 is connected to an outlet 1252 of the plasma chamber 1212 via a passage 1256. The device 1248 collects at least some of the material produced by the interaction between the toroidal plasma and the metal bearing gas that is output from the chamber 1212. Material (e.g., gases, fluids, particles) not collected by the device 1248 passes through the passage 1256 into a receptacle 1262. In one embodiment, the metal bearing gas comprises fluorine and the receptacle 1262 collects a gas comprising fluorine as a byproduct of the interaction of the toroidal plasma with the metal bearing gas. In this embodiment, the receptacle 1262 of the apparatus 1200 also has an outlet 1266. The outlet can, for example, exhaust to atmosphere or can be coupled to a pump (not shown).

The device 1248 can be, for example, a filter, particle trap, cyclone trap, electrostatic trap or other suitable device for collecting metallic materials, metallic oxides or metal nitrides produced by the interaction of the toroidal plasma with the metal bearing gas.

In this embodiment, the collection device 1248 is located external to the plasma chamber 1212. The collection device 1248 could, alternatively, be located within the plasma chamber 1212 or partially within the plasma chamber 1212. In some embodiments, the collection device 1248 is a replaceable component of the apparatus 1200.

By way of illustration, an experiment was conducted to process $WF_6$. The plasma source 1240 and plasma chamber 1212 used in the experiment were an ASTRONi® remote plasma source manufactured by MKS Instruments, Inc. of Wilmington, Mass. The metal bearing gas source 1204 provided $WF_6$ to the plasma chamber 1212. The plasma gas source 1224 provided a combination of $H_2$ and $N_2$ to the plasma chamber 1212. The plasma generator 1244 generated a toroidal plasma from the combination of gases located in the plasma chamber 1212. The toroidal plasma reacted with the $WF_6$ gas to produce W particles. Some of the W metal particles coated an interior surface of the passage 1256 at the outlet of the plasma chamber 1212. Energy-dispersive x-ray spectrometric (EDS) analysis was conducted on the materials output from the plasma chamber 1212 to verify the presence of tungsten (W). An exemplary EDS analysis system is a Noran Quest EDS system sold by Thermo Electron Corporation of Madison, Wis.

By way of illustration, another experiment was conducted to process $WF_6$. The plasma source 1240 and plasma chamber 1212 used in the experiment were an ASTRONi® remote plasma source manufactured by MKS Instruments, Inc. of Wilmington, Mass. The metal bearing gas source 1204 provided $WF_6$ to the plasma chamber 1212. The plasma gas source 1224 provided a combination of $O_2$ and $N_2$ to the plasma chamber 1212. The plasma generator 1244 generated a toroidal plasma from the combination of gases located in the plasma chamber 1212. The toroidal plasma reacted with the $WF_6$ gas to produce a metallic oxide material, $WO_3$. Energy-dispersive x-ray spectrometric analysis was conducted on the oxide material output from the plasma chamber 1212 to verify the presence of tungsten ($WO_3$). An exemplary EDS analysis system is a Noran Quest EDS system sold by Thermo Electron Corporation of Madison, Wis.

While the invention has been particularly shown and described with reference to specific embodiments, it should be understood by those skilled in the art that various changes in form and detail may be made therein without departing from the spirit and scope of the invention as defined by the appended claims.

What is claimed is:

1. A method for processing metal bearing gases, the method comprising:
    receiving a metal bearing gas in a plasma chamber at a pressure via an inlet to the plasma chamber;
    forming a toroidal plasma inside the plasma chamber, by passing current, generated by a solid state switching power supply comprising one or more switching semiconductor devices, through a primary winding of a transformer having a magnetic core surrounding a portion of the plasma chamber, the toroidal plasma reacting with the metal bearing gas to produce at least one of a metallic material, a metal oxide material or a metal nitride material; and
    collecting the at least one of a metallic material, a metal oxide material or a metal nitride material via a device disposed relative to the plasma chamber.

2. The method of claim 1, comprising providing at least a second gas to the plasma chamber.

3. The method of claim 2, comprising producing a metal oxide material or a metal nitride material by the interaction of the plasma, the metal bearing gas and the second gas.

4. The method of claim 1, further comprising collecting the at least one of a metallic material, a metal oxide material or a metal nitride material via the device.

5. The method of claim 1, wherein the collecting step comprises filtering the at least one of a metallic material, a metal oxide material or a metal nitride material via the device.

6. The method of claim 1, wherein the device is disposed external to the plasma chamber.

7. The method of claim 1, wherein the device is a replaceable portion of the plasma chamber.

8. The method of claim 1, wherein the device is selected from the group consisting of a filter, a particle trap, a cyclone trap or an electrostatic trap.

9. The method of claim 1, further comprising outputting the at least one of a metallic material, a metal oxide material or a metal nitride material via an outlet of the plasma chamber.

10. The method of claim 1, further comprising filtering the at least one of a metallic material, a metal oxide material or a metal nitride material via the device, wherein the device is selected from the group consisting of an external filter, particle trap, cyclone trap or electrostatic trap.

* * * * *